US008537505B2

(12) United States Patent
Shiimoto et al.

(10) Patent No.: US 8,537,505 B2
(45) Date of Patent: Sep. 17, 2013

(54) MAGNETORESISTIVE EFFECT HEAD HAVING A FREE LAYER AND A MAGNETIC DOMAIN CONTROL LAYER THAT APPLIES A MAGNETIC FIELD MORE STRONGLY IN AN UPPER PART OF THE FREE LAYER

(75) Inventors: Masato Shiimoto, Odawara (JP); Kan Yasui, Kodaira (JP); Nobuo Yoshida, Hiratsuka (JP); Hiroyuki Takazawa, Hino (JP)

(73) Assignee: HGST Netherlands B.V., Amsterdam (NL)

( * ) Notice: Subject to any disclaimer, the term of this patent is extended or adjusted under 35 U.S.C. 154(b) by 365 days.

(21) Appl. No.: 12/784,405

(22) Filed: May 20, 2010

(65) Prior Publication Data

US 2010/0302688 A1  Dec. 2, 2010

(30) Foreign Application Priority Data

May 26, 2009  (JP) ................. 2009-126848

(51) Int. Cl.
*G11B 5/39* (2006.01)
*G11B 5/11* (2006.01)

(52) U.S. Cl.
USPC ....... 360/324.12; 360/319; 360/320; 360/322

(58) Field of Classification Search
USPC ................. 360/317, 324.1, 324.11, 324.12, 360/324.2, 319, 320, 322
See application file for complete search history.

(56) References Cited

U.S. PATENT DOCUMENTS

| | | | |
|---|---|---|---|
| 7,035,062 B1 * | 4/2006 | Mao et al. | 360/324.2 |
| 2005/0146813 A1 * | 7/2005 | Oshima | 360/324.12 |
| 2006/0158789 A1 * | 7/2006 | Koyama et al. | 360/321 |
| 2008/0132039 A1 | 6/2008 | Cho et al. | 438/478 |
| 2012/0075751 A1 * | 3/2012 | Gill et al. | 360/319 |
| 2012/0099227 A1 * | 4/2012 | Lueng et al. | 360/245.3 |
| 2012/0134057 A1 * | 5/2012 | Song et al. | 360/319 |

OTHER PUBLICATIONS

Klaassen et al., "Broad-Band Noise Spectroscopy of Giant Magnetoresistive Read Heads"© 2005 IEEE, IEEE Transactions On Magnetics, vol. 41, No. 7, Jul. 2005, p. 2307-2317.

* cited by examiner

*Primary Examiner* — Jefferson Evans
(74) *Attorney, Agent, or Firm* — Zilka-Kotab, PC

(57) ABSTRACT

According to one embodiment, a magnetoresistive effect head includes a lower magnetic shield provided on a substrate, a magnetoresistive effect film laminated from a pinned layer with a pinned direction of magnetization, an intermediate layer, a free layer having a varying direction of magnetization controlled by an applied external magnetic field, a magnetic domain control layer formed with an intervening insulation layer on both sides in a track width direction of the magnetoresistive effect film, an upper magnetic shield, and electrodes for directing sense current flow in a direction perpendicular to a film surface of the magnetoresistive effect film, wherein a magnetic field applied by the magnetic domain control layer to a region away from an ABS of the free layer is at least 1.4 times larger than a magnetic field applied by the magnetic domain control layer to a region near the ABS of the free layer.

26 Claims, 37 Drawing Sheets

A  conventional structure
B  structure of Embodiment 1

A     Head advancing direction
B     Element height direction
C     Track width direction
D     topmost part in element height direction
E     air bearing surface

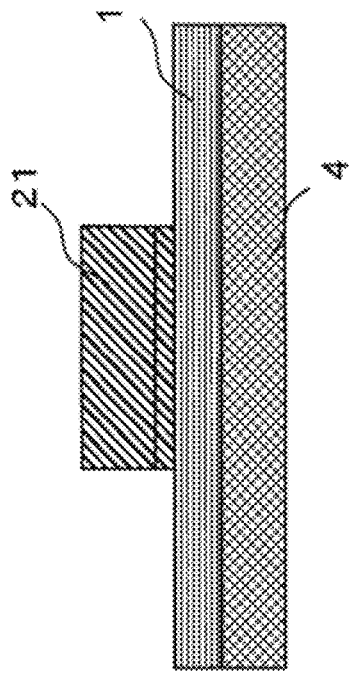
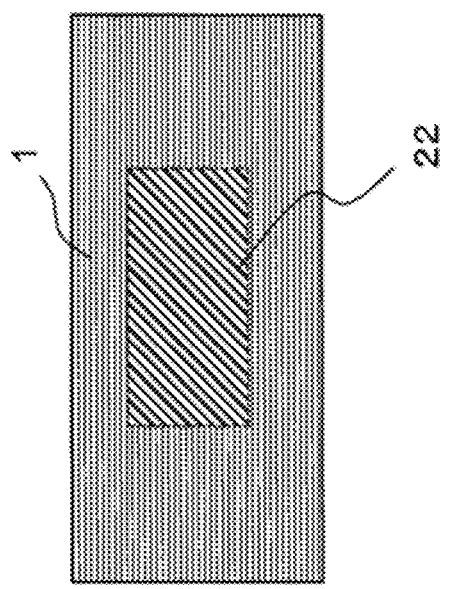
Figure 11(b)
Figure 11(a)

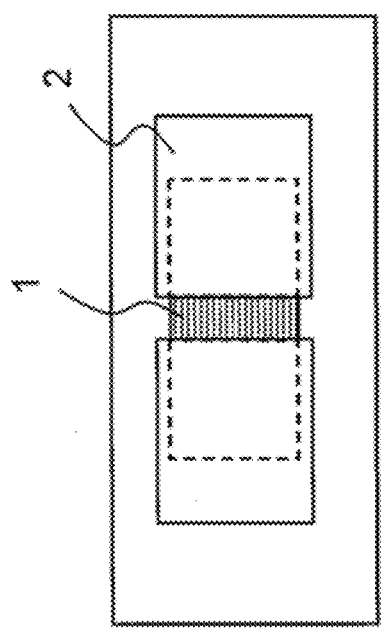
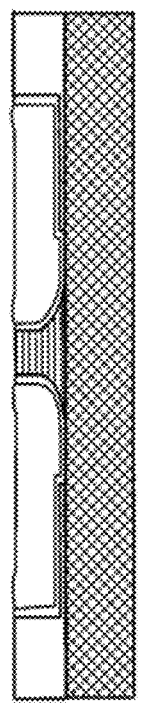
Figure 16(a)
Figure 16(b)

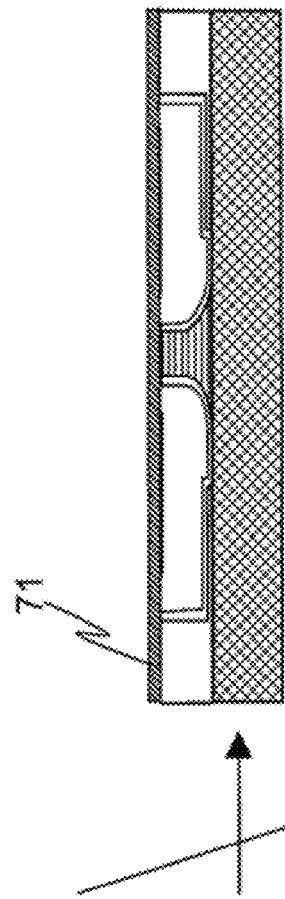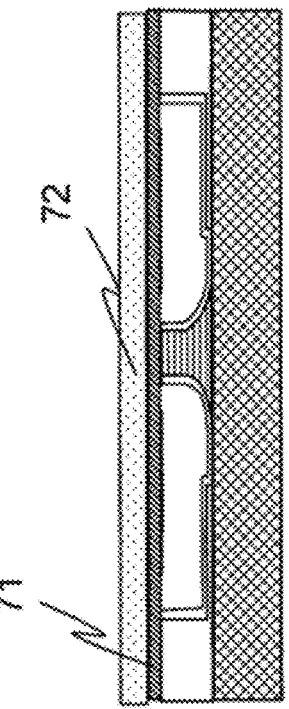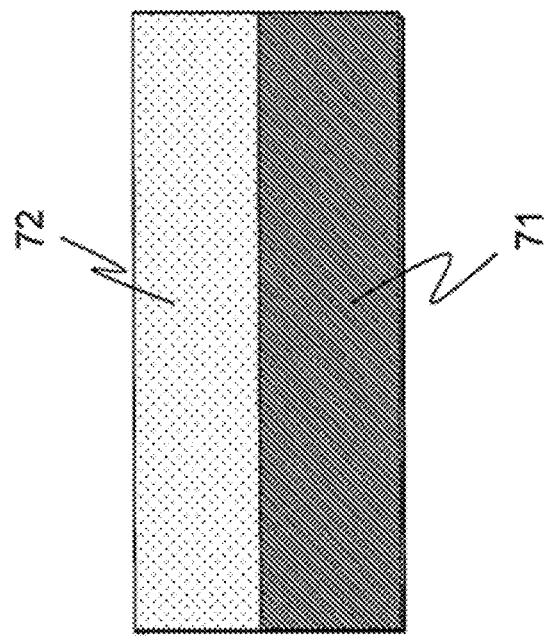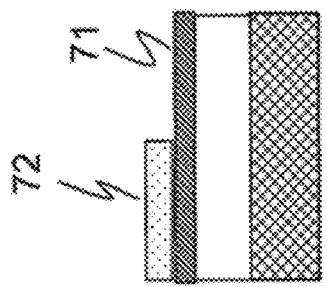

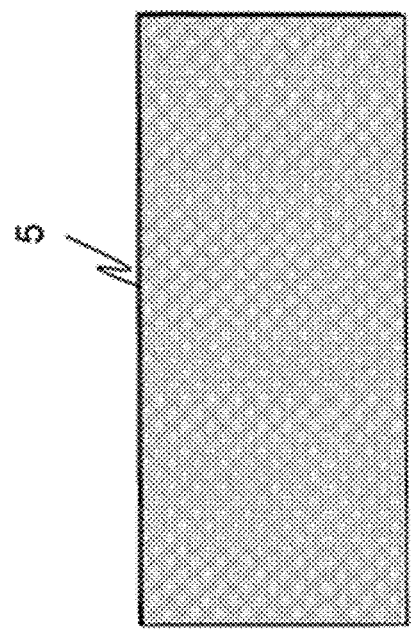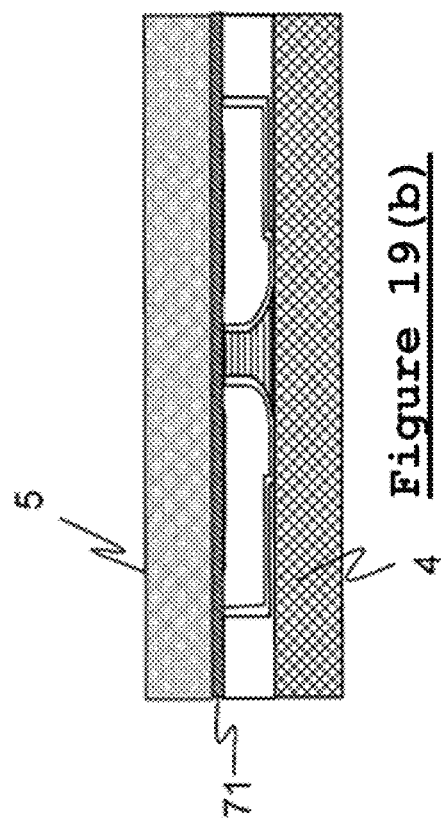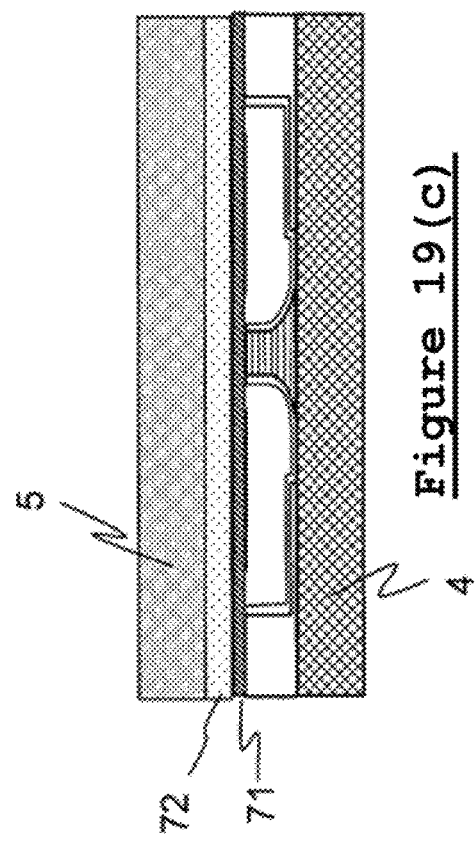
Figure 19(a)
Figure 19(b)
Figure 19(c)

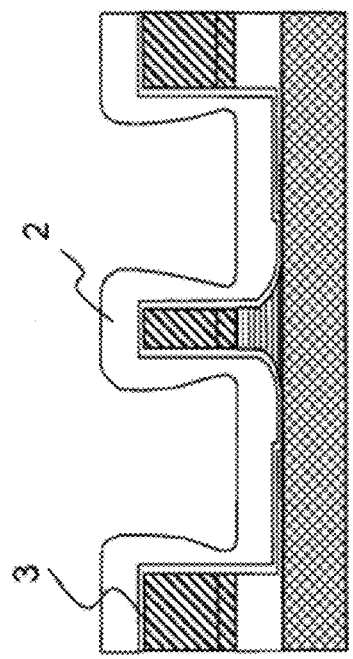
Figure 24(a)
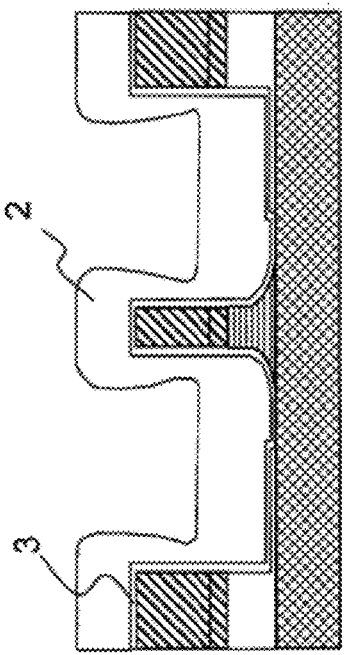
Figure 24(a')
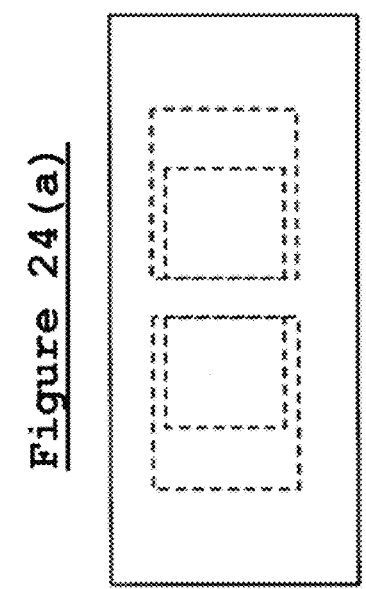
Figure 24(b)
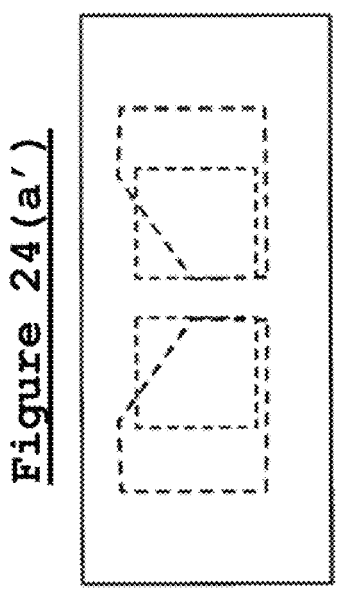
Figure 24(c)

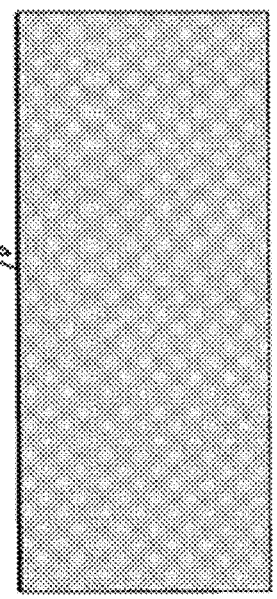
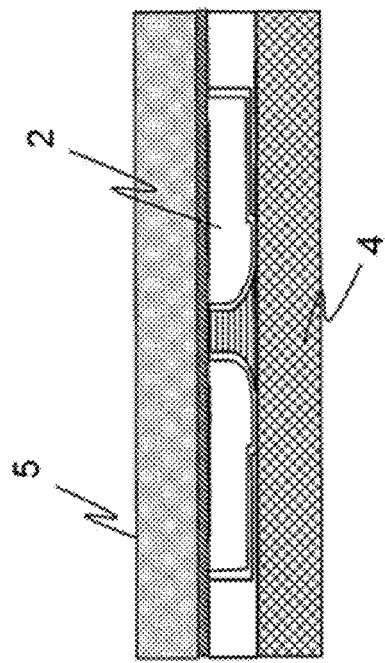
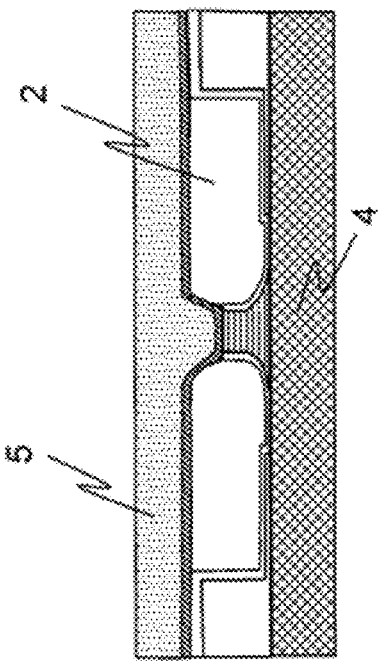

MAGNETORESISTIVE EFFECT HEAD HAVING A FREE LAYER AND A MAGNETIC DOMAIN CONTROL LAYER THAT APPLIES A MAGNETIC FIELD MORE STRONGLY IN AN UPPER PART OF THE FREE LAYER

RELATED APPLICATIONS

The present application claims priority to a Japanese Patent Application filed May 26, 2009, under Appl. No. 2009-126848, which is incorporated herein by reference.

FIELD OF THE INVENTION

The present invention relates to magnetoresistive heads, and specifically to a magnetoresistive effect head which may be used as a magnetic playback head in a magnetic recording/playback device.

BACKGROUND OF THE INVENTION

A magnetoresistive effect magnetic head is used as a sensor for playing back magnetic information recorded on magnetic recording media on high recording density magnetic recording devices, such as hard disk drives, and is a component of the disk drives which greatly affects the performance of magnetic recording techniques used therein.

Recently, the large magnetoresistive effect has been used in magnetic devices, along with the so-called giant magnetoresistive effect, on multilayer films having ferromagnetic metal layers laminated with a non-magnetic intermediate layer sandwiched in between. In this case, the electrical resistance is changed by the angle formed by the magnetizations of the two ferromagnetic layers sandwiching the non-magnetic intermediate layer. A structure called a spin valve is used such that this giant magnetoresistive effect may be used as a magnetoresistive element. The spin valve usually has a laminated structure of an anti-ferromagnetic layer, a ferromagnetic layer, a non-magnetic intermediate layer, and a ferromagnetic layer, but is not so limited. The magnetization of the ferromagnetic layer in contact with the anti-ferromagnetic layer is essentially pinned by an exchange-coupling magnetic field generated at the boundary surface of the anti-ferromagnetic layer and the ferromagnetic layer.

The output from these devices is generally obtained by freely rotating the magnetization of the other ferromagnetic layer by an external magnetic field. The ferromagnetic layer having magnetization essentially pinned by the anti-ferromagnetic layer is referred to as the pinned layer. The ferromagnetic layer having magnetization which is rotated by the external magnetic field is referred to as the free layer. The playback output is produced as the product of the magnetoresistive (MR) ratio, which is the rate of change in the resistance which depends on the drive voltage and the magnetoresistive effect and the efficiency of the device. The efficiency is an index for indicating how much of the magnetization of the free layer is rotated by the magnetic field applied from the magnetic recording medium. The output increases as the efficiency increases. However, if the output is too large, the change in resistance with respect to the magnetic field becomes nonlinear. Because the performance of a magnetic recording/playback device degrades with nonlinear magnetic fields, normally, the efficiency is set to approximately 20% to 30%. The magnitude of the efficiency is usually controlled to be appropriate by optimizing the materials and the film thicknesses of the magnetic domain control layers provided on both sides in the track direction of the multilayered film of the magnetoresistive effect head.

The current-in-plane (CIP)-giant magnetoresistive (GMR) head using the flow of current in the in-plane direction of a laminated film has been adopted in a spin valve using the magnetoresistive effect. Today, the transition continues toward a tunneling magnetoresistive (TMR) head or a current-perpendicular-to-the-plane (CPP)-GMR head which use the flow of current in the direction of the film thickness of the laminated film. These magnetoresistive effect films are structures which were developed with the objective of improving the signal-to-noise ratio (SNR) of a magnetic head. To increase the playback output, usually, the magnetoresistive (MR) ratio is increased. Currently, the TMR head, which has the highest MR ratio, is used widely for this reason.

Some of the known types of noise include Johnson noise and shot noise originating in the resistance, and Barkhausen noise generated in the magnetic domain of the free layer. Because Johnson noise and shot noise depend on the resistance, an effective way to reduce these types of noise is to reduce the head resistance. Development in this area is progressing with magnetoresistive effect films realizing a high MR ratio and a low electrical resistance. Barkhausen noise is generated when the free layer magnetization has magnetic domains. The generation of magnetic domains can be suppressed by a magnetic domain control layer provided in the magnetoresistive effect head.

However, in the past few years, in addition to the noise sources described above, a noise (mag-noise) generated by the thermal vibrations in the magnetization of the free layer has clearly become a noise problem in devices using magnetoresistive effect heads. Mag-noise ($N_{mag}$) can be theoretically calculated from Equation 1, below.

$$N_{mag} = \frac{\Delta R}{H_{stiff}} \sqrt{\frac{4 k_B T \alpha}{\mu_0 M_s V \gamma}} \qquad \text{Equation 1}$$

Here, $\Delta R$ is the maximum change in resistance of a magnetic sensor, $H_{stiff}$ is the effective magnetic field controlling the magnetic domain received by the magnetic sensor, $k_B$ is the Boltzmann's constant ($1.38 \times 10^{-23}$ J/K), T is the element temperature, $\alpha$ is the Gilbert damping constant, $\mu_0$ is the magnetic permeability in a vacuum, Ms is the saturated magnetization of the free layer, V is the volume of the free layer, and $\gamma$ is the gyromagnetic constant ($2.78 \times 10^3$ in/As). This equation is based on the assumption that the magnetization in the entire free layer vibrates uniformly. In practice, the film characteristics of a magnetoresistive effect film are nearly uniform in the film surface, and Equation 1 therefore holds.

The features of mag-noise are the inversely proportional relationship to the square' root of the volume of the free layer and the proportional relationship to the playback output. The first feature means that when the magnetic sensor, and therefore the volume of the free layer, decreases as the recording density increases, the mag-noise essentially increases. The second feature means that the head SNR saturates at some maximum value because the mag-noise increases proportionally when the playback output increases.

Recently, the MR ratio of a CPP-magnetoresistive effect head, represented by a TMR-head installed in a magnetic recording and playback device, has improved noticeably, but simultaneously the mag-noise has increased sharply. Therefore, the head SNR approaches the saturation value predicted theoretically. In other words, the mag-noise was not a problem in conventional CIP-magnetoresistive effect heads because the MR ratio did not increase. The important issue in order to improve the head SNR was to improve the MR ratio when dealing with CIP heads. In contrast, in recent CPP-magnetoresistive effect heads having a high MR ratio, the most important issue is to reduce the mag-noise without lowering the playback output.

However, mag-noise is extremely difficult to reduce without lowering the playback output. For example, since the mag-noise is inversely proportional to $H_{stiff}$ from Equation 1, the mag-noise decreases when the magnetic field controlling the magnetic domain strengthens. However, because the efficiency is inversely proportional to $H_{stiff}$, the playback output decreases in proportion to the mag-noise, and the head SNR does not improve. For the same reason, even if the film thickness or the Ms of the free layer is increased, the mag-noise decreases, but the head SNR does not improve because the efficiency decreases. Thus, because the mag-noise and the efficiency essentially have a trade-off relationship, an effective means for lowering the mag-noise without lowering the playback output would be very beneficial to the field of making and using magnetic heads using current magnetoresistive technologies.

SUMMARY OF THE INVENTION

According to one embodiment, a magnetoresistive effect head includes a lower magnetic shield provided on a substrate, a magnetoresistive effect film laminated from a pinned layer with a pinned direction of magnetization, an intermediate layer, a free layer having a varying direction of magnetization controlled by an applied external magnetic field, a magnetic domain control layer formed with an intervening insulation layer on both sides in a track width direction of the magnetoresistive effect film, an upper magnetic shield, and electrodes for directing sense current flow in a direction perpendicular to a film surface of the magnetoresistive effect film, wherein a magnetic field applied by the magnetic domain control layer to a region away from an air bearing surface (ABS) of the free layer is at least 1.4 times larger than a magnetic field applied by the magnetic domain control layer to a region near the ABS of the free layer.

In another embodiment, a magnetoresistive effect head includes a lower magnetic shield provided on a substrate, a magnetoresistive effect film laminated from a pinned layer with a pinned direction of magnetization, an intermediate layer, a free layer having a varying direction of magnetization, a magnetic domain control layer formed with an intervening insulation layer on both sides in a track width direction of the magnetoresistive effect film, an upper magnetic shield, and electrodes for directing sense current flow in a direction perpendicular to a film surface of the magnetoresistive effect film, wherein a distance between the upper magnetic shield and a center of the free layer in a region away from an air bearing surface (ABS) is at least 1.3 times a distance between the upper magnetic shield and the center of the free layer at the ABS.

According to another embodiment, a magnetoresistive effect head includes a lower magnetic shield provided on a substrate, a magnetoresistive effect film laminated from a pinned layer with a pinned direction of magnetization, an intermediate layer, a free layer having a varying direction of magnetization, a magnetic domain control layer formed with an intervening insulation layer on both sides in a track width direction of the magnetoresistive effect film, an upper magnetic shield, and electrodes for directing sense current flow in a direction perpendicular to a film surface of the magnetoresistive effect film, wherein a film thickness of the magnetic domain control layer in a region away from an air bearing surface (ABS) is at least 1.2 times a film thickness of the magnetic domain control layer at the ABS.

Any of these embodiments may be implemented in a magnetic data storage system such as a disk drive system, which may include a magnetic head, a drive mechanism for passing a magnetic medium (e.g., a hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

BRIEF DESCRIPTION OF THE DRAWINGS

FIGS. 11(a)-11(b) are illustrative views continued from FIGS. 10(a)-10(b), according

FIGS. 16(a)-16(b) are illustrative views continued from FIGS. 15(a)-15(b), according to one embodiment.

FIGS. 18(a)-18(d) are illustrative views continued from FIGS. 17(a)-17(c), according to one embodiment.

FIGS. 19(a)-19(c) are illustrative views continued from FIGS. 18(a)-18(d), according to one embodiment.

FIGS. 24(a)-24(c) are illustrative views continued from FIGS. 13(a)-13(b), according to one embodiment.

FIGS. 26(a)-26(c) are illustrative views continued from FIGS. 25(a)-25(c), according to one embodiment.

DETAILED DESCRIPTION

Figure 1:
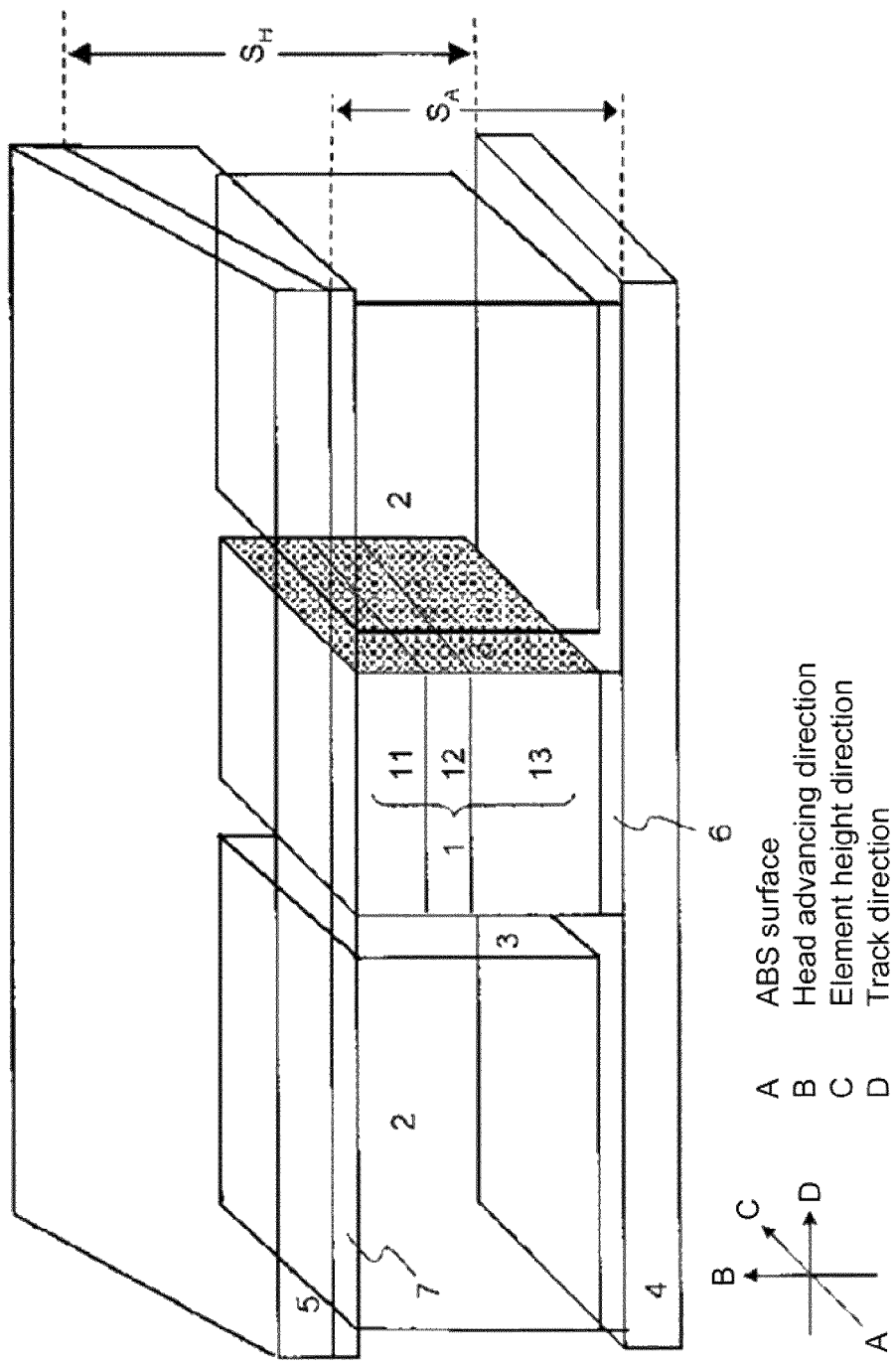
FIG. 1 is a perspective view showing a magnetoresistive effect head, according to one embodiment, when viewed from the ABS.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

According to one general embodiment, a magnetoresistive effect head includes a lower magnetic shield provided on a substrate, a magnetoresistive effect film laminated from a pinned layer with a pinned direction of magnetization, an intermediate layer, a free layer having a varying direction of magnetization controlled by an applied external magnetic field, a magnetic domain control layer formed with an intervening insulation layer on both sides in a track width direction of the magnetoresistive effect film, an upper magnetic shield, and electrodes for directing sense current flow in a direction perpendicular to a film surface of the magnetoresistive effect film, wherein a magnetic field applied by the magnetic domain control layer to a region away from an air bearing surface (ABS) of the free layer is at least 1.4 times larger than a magnetic field applied by the magnetic domain control layer to a region near the ABS of the free layer.

In another general embodiment, a magnetoresistive effect head includes a lower magnetic shield provided on a substrate, a magnetoresistive effect film laminated from a pinned layer with a pinned direction of magnetization, an intermediate layer, a free layer having a varying direction of magnetization, a magnetic domain control layer formed with an intervening insulation layer on both sides in a track width direction of the magnetoresistive effect film, an upper magnetic shield, and electrodes for directing sense current flow in a direction perpendicular to a film surface of the magnetoresistive effect film, wherein a distance between the upper magnetic shield and a center of the free layer in a region away from an air bearing surface (ABS) is at least 1.3 times a distance between the upper magnetic shield and the center of the free layer at the ABS.

According to another general embodiment, a magnetoresistive effect head includes a lower magnetic shield provided on a substrate, a magnetoresistive effect film laminated from a pinned layer with a pinned direction of magnetization, an intermediate layer, a free layer having a varying direction of magnetization, a magnetic domain control layer formed with an intervening insulation layer on both sides in a track width direction of the magnetoresistive effect film, an upper magnetic shield, electrodes for directing sense current flow in a direction perpendicular to a film surface of the magnetoresistive effect film, wherein a film thickness of the magnetic domain control layer in a region away from an air bearing surface (ABS) is at least 1.2 times a film thickness of the magnetic domain control layer at the ABS.

According to some embodiments, the problems associated with the miniaturization of the magnetoresistive effect film in a CPP-magnetoresistive effect head and the reduction in the head SNR caused by the increase in the mag-noise accompanying the increase in the playback output of the CPP-magnetoresistive effect head may be reduced or eliminated through techniques and systems described herein. In addition, higher recording densities may be achieved as a result of the improvements described herein.

In one embodiment, methods and systems described herein reduce the mag-noise without inviting a decrease in the playback output in a CPP-magnetoresistive effect head.

A CPP-magnetoresistive effect film is used as the sensor film of a magnetoresistive effect head, in one embodiment. A pair of electrodes for directing current flow vertically in the magnetoresistive effect film and a pair of magnetic shields are provided. In addition, a magnetic domain control layer for magnetizing the free layer as a monodomain is provided on both ends in the track width direction of the magnetoresistive effect film. A non-magnetic insulation layer is provided between the magnetic domain control layer and the magnetoresistive effect film. The following structure is adopted in the present invention for this type of magnetoresistive effect head.

The magnetoresistive effect head may be constructed so that the magnetic field applied from the magnetic domain control layer of the magnetoresistive effect film to the free layer is stronger in a part further from the air bearing surface (ABS) of the free layer than in a part close to the ABS. Here, the ABS is the surface of the magnetoresistive effect head which is opposite to and closest to the magnetic recording medium, e.g., it faces the magnetic recording medium.

Specifically, the magnetoresistive effect head, in one embodiment, has a CPP magnetoresistive effect film, a pair of electrodes and a pair of magnetic shields provided on the top and the bottom in the direction of the film thickness of the CPP-magnetoresistive effect film, magnetic domain control layers provided on both sides of the free layer in the track width direction, and a non-magnetic region provided between the free layer and the magnetic domain control layer. A feature in one embodiment is that the applied magnetic field from the magnetic domain control layer which is applied to the free layer is stronger in the upper part in the element height direction than in the vicinity of the ABS. The pair of electrodes may also be used as the pair of magnetic shields.

Furthermore, the following seven examples are specific structures which illustrate and explain the above conditions.

In a first example (1) a magnetoresistive effect head in has a gap between the magnetic shields in the vicinity of the ABS which is smaller than a gap between the magnetic shields in the upper part of the element. In a second example (2) a magnetoresistive effect head has a film thickness of the magnetic domain control layer in the vicinity of the ABS that is thinner than a film thickness of the magnetic domain control layer in the upper part of the element. In a third example (3) a magnetoresistive effect head has a film thickness in the track width direction of the insulation layer in the region in contact with the free layer in the vicinity of the ABS that is thicker than the film thickness in the track width direction of the insulation layer in the region in contact with the free layer in the upper part of the element.

In a fourth example, the magnetoresistive effect head in (1), plus the cap layer is comprised of at least one layer between the CPP-magnetoresistive effect film and The magnetic shield in the upper part, and the film thickness of the cap layer at a position close to the magnetic recording medium is thinner than the film thickness of the cap layer at a position far from the magnetic recording medium. In a fifth example (5) the magnetoresistive effect head in (2) in which the upper surface of the magnetic domain control layer is inclined, and the film thickness of the magnetic domain control layer is thicker on the side of the magnetic shield in the upper part where furthest away from the magnetic recording medium. In a sixth example, the magnetoresistive effect head in (2) in which the lower surface of the magnetic domain control layer is inclined, and the position of the lower end of the magnetic domain control layer approaches the substrate side as the position moves away from the magnetic recording medium. Also, in a seventh example (7) the magnetoresistive effect head in (2) in which the upper surface and the lower surface of the magnetic domain control layer are inclined, and the film thickness is thicker on the side of the magnetic shield in the upper part where furthest away from the magnetic recording medium, and the position of the lower end of the magnetic domain control layer approaches the substrate side as the position moves away from the magnetic recording medium.

In the above structures, the magnitude of the magnetic field applied from the magnetic domain control layer to the region furthest from the ABS of the free layer may be at least 1.4 times the magnitude of the magnetic field applied to the region closest to the ABS, and is effective in reducing the mag-noise.

According to some embodiments, the head SNR can be improved and a high recording density can be achieved by reducing the mag-noise without reducing the playback output.

Embodiments of the present invention are described below with reference to the figures. To facilitate understanding, the same reference numbers are assigned to describe the same function parts in the following figures.

FIG. 1 is a perspective view of the magnetoresistive effect head when viewed from the ABS, in one embodiment. The magnetoresistive effect head has a magnetoresistive effect film 1, a magnetic domain control layer 2, an insulation layer 3 provided between the magnetoresistive effect film 1 and the magnetic domain control layer 2, a lower magnetic shield 4, an upper magnetic shield 5, a lower cap film 6, and an upper cap film 7. The magnetoresistive effect film 1 has a free layer 11, an intermediate layer 12, and a pinned layer 13. In the illustrated structure examples, there is only one magnetoresistive effect film 1. However, even in a so-called differential motion playback head in which two magnetoresistive effect films are connected in series and the differential output of the magnetoresistive effect films is detected, the present embodiment may be employed to effect the reduction in mag-noise desired.

In this embodiment, the upper and lower magnetic shields 4, 5 are also used as the electrodes. A feature of this embodiment is that the distance $S_H$ between the upper and the lower magnetic shields in the upper part in the element height direction is larger than the distance $S_A$ between the upper and the lower magnetic shields in the vicinity of the ABS. As the distance between the magnetic shields increases, the amount of magnetic flux flowing to the lower magnetic shield 4 or the upper magnetic shield 5 from the magnetic domain control layer 2 decreases, and the magnetic field controlling the magnetic domain applied to the free layer 11 becomes stronger. In other words, the magnetic field $HB_H$ for controlling the magnetic domain applied from the magnetic domain control layer 2 in the vicinity of the upper part in the element height direction of the free layer 11 of the magnetoresistive effect head of this embodiment is larger than the magnetic field $HB_A$ for controlling the magnetic domain in the vicinity of the ABS. In addition, the mag-noise of the entire magnetoresistive effect head can be reduced. A detailed description of the reduction effect of the mag-noise is explained later.

Figure 2:
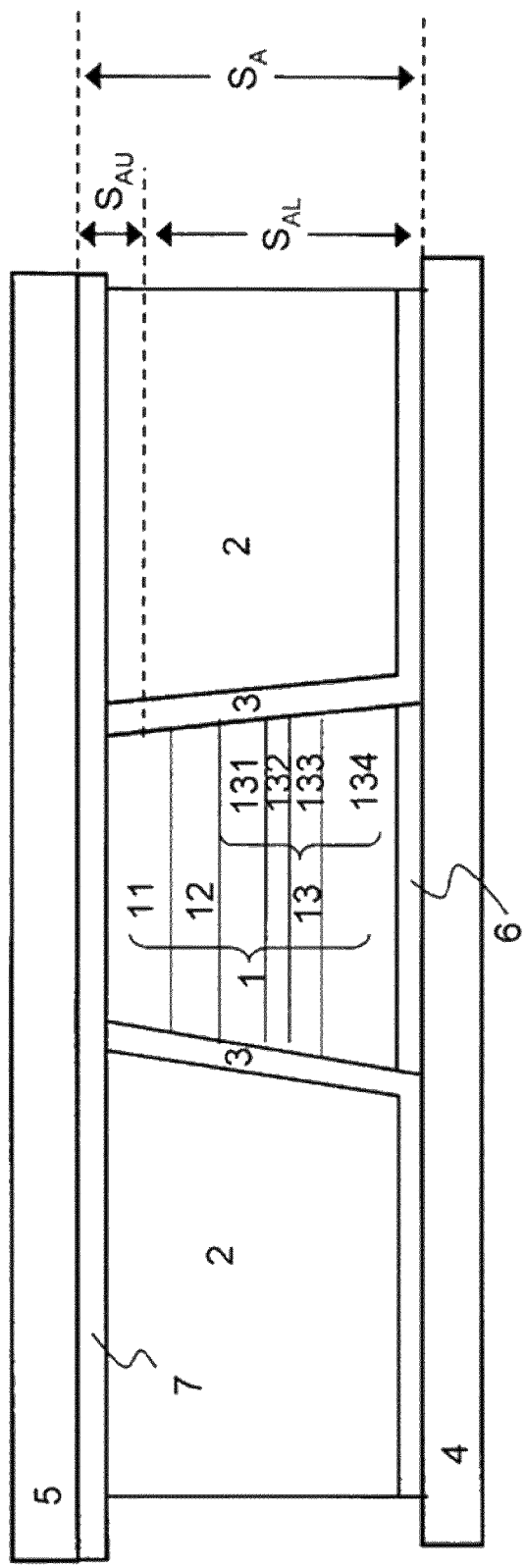
FIG. 2 is a cross-sectional view of the upper part in the element height direction when the magnetoresistive effect head, according to one embodiment, is viewed from the ABS.
Figure 3:
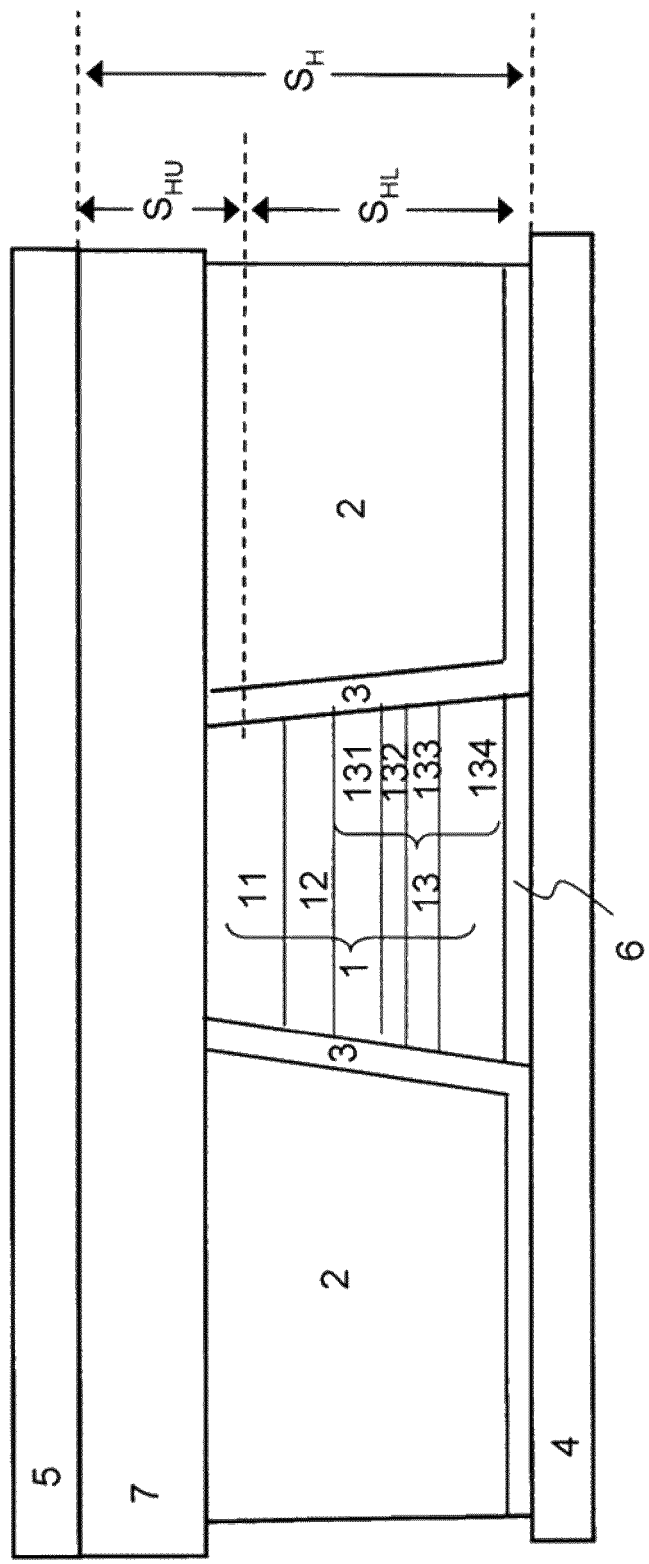
FIG. 3 is a cross-sectional view of the magnetoresistive effect head, according to one embodiment, when viewed from the ABS.

FIGS. 2 and 3 are cross-sectional views of the ABS and the upper part in the element height direction of the magnetoresistive effect head of this embodiment. FIG. 2 is a view of the ABS side, in one embodiment. FIG. 3 is a cross-sectional view in the upper part in the element height direction, in another embodiment.

Specifically, the magnetoresistive effect film 1 is constructed from a free layer 11, an intermediate layer 12, and a pinned layer 13, and features rotating the magnetization of the free layer by an external magnetic field to change the electrical resistance. Generally, the pinned layer is constructed as an anti-ferromagnetic layer 134, a first pinned layer 133, an anti-parallel coupling layer 132, and a second pinned layer 131. The anti-ferromagnetic layer 134 applies an exchange-coupling bias for essentially pinning the magnetization of the first pinned layer 133, and achieves the effect by being formed in contact with the first pinned layer 133 or indirectly through magnetic coupling, in one approach. Alternately, another bias application mechanism instead of the anti-ferromagnetic layer 134, for example, may use the residual magnetization of a hard magnetic film, or use an electrical current bias, in other approaches. In this embodiment, the pinned layer 13 is a laminated ferrimagnet pinned layer in which the magnetizations of the first pinned layer 133 and the second pinned layer 131 are mutually coupled through the anti-parallel coupling layer 132 to become anti-parallel. The coupling is sufficiently large for the magnetic field being sensed. The pinned layer 13 does not have any problems previously described even if it is a so-called single pinned layer comprised of an anti-ferromagnetic layer 134 and a first pinned layer 133.

In the second pinned layer 131 and the first pinned layer 133, for example, a single-layer film of CoFe alloy, NiFe alloy, CoFeB alloy, CoMnGe Heusler alloy, CoMnSi Heusler alloy, CoCrAl Heusler alloy, CoFeAl alloy, or a laminated film combining these alloys, etc., may be used, in one approach. The same or different materials may be used in the second pinned layer 131 and the first pinned layer 133. The materials of Ru, Ir, Cr, Rh, Re, Os, Pt, etc., having an appropriately selected thickness may be used in the anti-parallel coupling layer 132, in one approach.

The direction of magnetization in the free layer 11 is changed in response to the magnetic field being sensed, according to one embodiment. The output is generated by the relative angle between magnetization of the free layer 11 which changes direction in response to the magnetic field being sensed and the magnetization of the pinned layer pinned toward the magnetic field being sensed or the second pinned layer 131. Cu, Au, Ag, an alloy of these elements, etc., may be used to generate the magnetoresistive effect in the intermediate layer 12, in one approach. An insulation material such as alumina ($Al_2O_3$), titanium oxide, MgO, etc., may be used to generate a tunnel magnetoresistive effect, in one approach. The free layer 11 may be, for example, a laminated film of CoFe alloy, NiFe alloy, etc.; a single-layer film of CoFeB alloy, CoMnGe Heusler alloy, CoMnSi Heusler alloy, CoCrAl Heusler alloy, CoFeAl alloy, etc.; a laminated film combining these alloys, etc. In addition, the free layer 11 may use a laminated ferrimagnet free layer in which a first free layer and a second free layer are coupled through the anti-parallel coupling layer to have mutually anti-parallel magnetizations, in one approach.

Magnetic domain control layers 2 are provided on both sides in a track width direction of the magnetoresistive effect film 1. The magnetic domain control layer 2 may be formed from a CoPt alloy, a CoPtCr alloy, etc., in one approach. Even if there is sufficient saturated magnetization to form a monodomain in the free layer 11, there are no special restrictions on the materials. The crystal structure of an alloy such as a CoPt alloy, a CoPtCr alloy, etc., generally becomes a mixed phase of a face-centered cubic structure and a close-packed hexagonal structure. In this embodiment, preferably, the center in the direction of the film thickness of the magnetic domain control layer 2 and the center in the direction of the film thickness of the free layer 11 roughly coincide. However, even if the center positions differ, if an adequate magnetic field is applied to form the free layer 11 into a monodomain, there is no particular significant effect on the performance of the magnetoresistive effect head.

The insulation layer 3 is formed between the magnetic domain control layer 2 and the magnetoresistive effect film 1. The insulation layer 3 may be formed from an insulation material, such as $Al_2O_3$, $SiO_2$, AlN, SiN, mixtures and multilayered films thereof, etc., may be used to prevent short circuiting of the lower magnetic shield 4 and the upper magnetic shield 5. Preferably, these are simply formed by a sputtering method, but any method of formation may be used as would be known to one of skill in the art.

A single layer or a multilayered film of a Ni—Fe alloy and a nitride, Co—Zr, Co—Hf, a Co—Ta amorphous alloy, etc., may be used as the lower magnetic shield 4 and the upper magnetic shield 5. These may be simply formed by a sputtering method, a plating method, etc. The magnetic shields play the role of reducing the effect of the leakage magnetic field other than from the bits being sensed in high linear recording density. The damping of the playback output by the high linear recording density is reduced. Consequently, as the magnetic shield gap becomes smaller, the resolution of the magnetoresistive effect head improves. The effect of the static magnetic fields from neighboring bits is small in the upper part in the element height direction, and the resolution is determined mostly by the magnetic shield gap in the vicinity of the ABS.

The lower cap layer 6 and the upper cap layer 7 may be formed from a conductive single metal such as Ta, Cu, Au, Rh, Ru, etc., or their alloys. In this embodiment, the film thickness of the upper cap layer may be intentionally formed to be different in the vicinity of the ABS and in the upper part in the element height direction. The upper cap layer 7 may be formed so that the distance $S_{AU}$ between the center of the free layer 11 in the vicinity of the ABS and the upper magnetic shield 5 and the distance $S_{HU}$ between the center of the free layer 11 in the upper part in the element height direction and the upper magnetic shield 5 have the following relationship, in one embodiment.

$$S_{HU} > S_{AU} \qquad \text{Equation 2}$$

Figure 4:
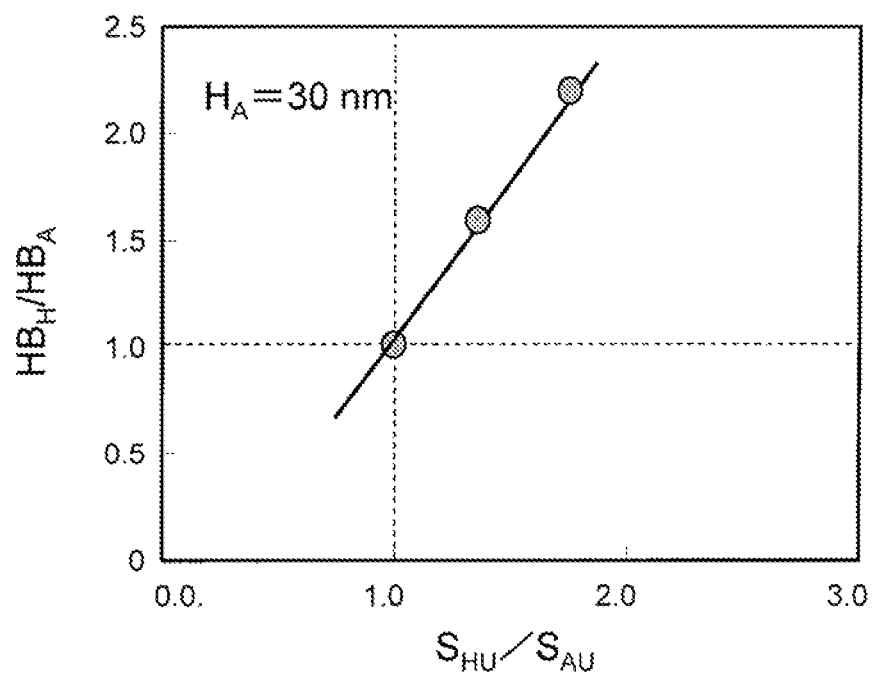
FIG. 4 is a graph showing the relationship of the $HB_H/HB_A$ ratio of the magnetic fields controlling the magnetic domains applied to the upper part of the element in the free layer and near the air bearing surface and the $S_{HU}/S_{AU}$ ratio of the distances between the upper magnetic shield and the center of the free layer near the air bearing surface of the upper part of the element, according to one embodiment.

FIG. 4 shows the relationship between the $HB_H/HB_A$ ratio of the magnetic fields controlling the magnetic domains applied to the upper part in the element height direction of the free layer and to the vicinity of the ABS, and the $S_{HU}/S_{AU}$ ratio of the distances between the upper magnetic shield 5 and the center of the free layer 11 in the upper part in the element height direction and in the vicinity of the ABS, in one embodiment. The magnetic field controlling the magnetic domain is stronger at the track end and is damped as the center is approached. $HB_H$ and $HB_A$ define the average values in the track width direction and are determined by finite element method calculations.

From FIG. 4, the relationship of $HB_H$ and $HB_A$ may be described as shown in Equation 3, below, can be achieved by satisfying Equation 2. In addition, as $S_{HU}/S_{AU}$ becomes larger, a large difference can be set for $HB_H$ and $HB_A$.

$$HB_H > HB_A \qquad \text{Equation 3}$$

Figure 5:
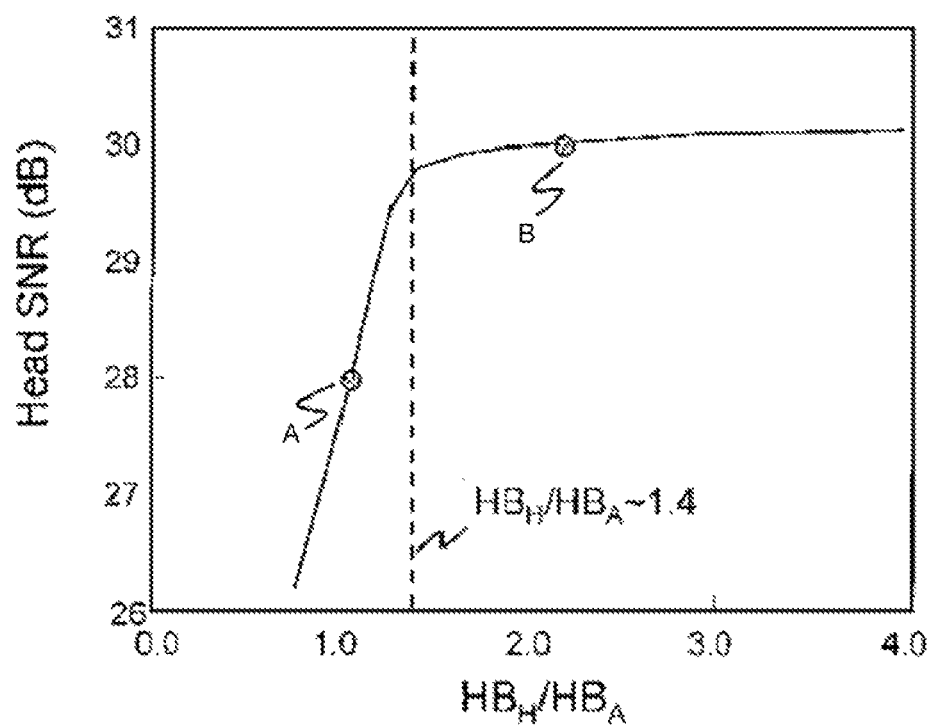
FIG. 5 is a graph showing the relationship of the head SNR and the $HB_H/HB_A$ ratio of the magnetic fields controlling the magnetic domains applied to the upper part of the element in the free layer and the vicinity of the ABS, according to one embodiment.

The $HB_H/HB_A$ condition which obtains a satisfactory head SNR improvement by reducing the mag-noise is described for this embodiment. FIG. 5 shows the relationship between the head SNR and $HB_H/HB_A$, according to one embodiment. The conventional structure is a structure in which $S_{HU}=S_{AU}$. From FIG. 5, compared to the conventional structure, this embodiment has an appropriate range an appropriate range from 1.4 and higher for $HB_H/HB_A$ which obtains an adequate improvement in the head SNR. When $HB_H/HB_A$ is at least 1.4, the percentage increase in the head SNR is small, according to one embodiment. Therefore, if $HB_H/HB_A$ is at least 1.4, a large difference is not produced in the performance of the magnetoresistive effect head, according to one embodiment. Similarly, there are no special limitations on the maximum value of $HB_H/HB_A$ from the perspective of the head SNR. $HB_A$ may maintain a magnitude which enables adequate magnetic domain control, and preferably has a magnitude from at least about 300 Oe to about 600 Oe.

Table 1 shows effects obtained from this embodiment.

TABLE 1

|  | Embodiment 1 | Example of a conventional structure |
| --- | --- | --- |
| $S_{HU}/S_{AU}$ | 2.5 | 1 |
| $HB_H/HB_A$ | 2.2 | 1.1 |
| Head SNR (dB) | 30 | 28 |
| Efficiency (%) | 25 | 27 |
| Mag-noise (nV/Hz$^{1/2}$) | 30 | 40 |

In the embodiment shown in FIGS. 2 and 3, $S_{HU}/S_{AU}$ is 2.5, $S_{HU}$ is 10 nm, and $S_{AU}$ is 4 nm. $HB_{AU}$ is 600 Oe, and $HB_{HU}$ is 1300 Oe. $HB_H/HB_A$ becomes 2.2. The condition of $HB_H/HB_A$ being at least 1.4, as required by the present embodiment, is satisfied. The structure of the example of a conventional structure compared to this embodiment differs in that the structure of the present invention differs only in that $S_{HU}$ equals $S_{AU}$. The structures in the ABS and the upper part in the element height direction are equivalent. Both the ABS and the upper part in the element height direction are structures having the cross-sectional view shown in FIG. 2. The head SNR of the magnetoresistive effect head according to this embodiment is approximately 30 dB. In contrast, the head SNR of a magnetoresistive effect film having a conventional structure is 28 dB, and the head SNR improvement can be confirmed. In Table 1, the $HB_H/HB_A$ for an ordinary magnetoresistive effect head becomes larger than 1.0 at 1.1. The magnetic field controlling the magnetic domain in the vicinity of the ABS of an actual magnetoresistive effect head is about 10% lower than the upper part in the element height direction due to the effect of the anti-magnetic field. However, the difference in strength of the magnetic field controlling the magnetic domain at this level has little effect on the head SNR and the mag-noise.

As described earlier, preferably, $HB_H/HB_A$ is at least 1.4 in the head SNR improvement and the mag-noise reduction. In the structure of this embodiment, a structure having $S_{HU}/S_{AU}$ of at least 1.3 from FIG. 4 may be preferred since $HB_H/HB_A$ is at least 1.4. The maximum value of $S_{HU}/S_{AU}$ is not particularly limited from the perspective of the maximum value of the $HB_H/HB_A$, but from the perspective of the manufacturing process, the range of 10 and below is practical for manufacturing, in one approach.

A mechanism capable of reducing mag-noise without inviting a reduction in the playback output according to one embodiment is described below. First, if in a normal magnetoresistive effect head, the magnitudes of the mag-noise are equal in the vicinity of the ABS and the upper part in the element height direction. This occurs for the following reasons. The magnetic characteristics of the magnetoresistive effect film are nearly uniform in the film surface. In addition, the film thickness of the magnetic domain control layer and the distance between the magnetic domain control layer and the free layer are equally independent of the position in the element height direction. Therefore, $H_{stiff}$ in Equation 1 hardly depends at all on the position in the element height direction. On the other hand, the magnetization of the upper part of the element hardly contributes at all to the output in contrast to the large contribution to the output of the free layer magnetization in the vicinity of the ABS.

Figure 6:
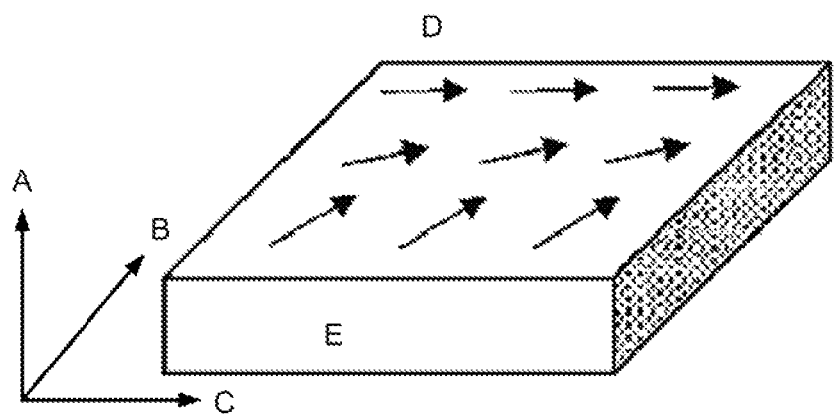
FIG. 6 is a schematic view of the magnetized state in the free layer when a magnetic field is applied from a magnetic recording medium, according to one embodiment.
Figure 7:
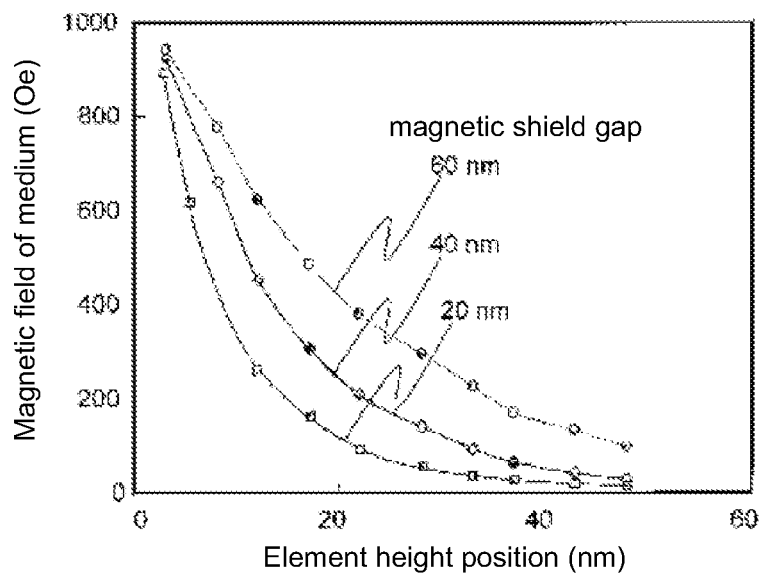
FIG. 7 is a graph showing the dependence on the element height position of the magnetic field applied to the free layer from the magnetic recording medium, according to one embodiment.

FIG. 6 is a schematic view of the magnetized state in the free layer when a magnetic field is applied from the magnetic recording medium, according to one embodiment. The angle of rotation of the free layer magnetization is large in the vicinity of the ABS. In contrast, the free layer magnetization barely rotates at all in the upper part in the element height direction. In other words, the free layer magnetization in the upper part in the element height direction hardly contributes at all to the efficiency compared to the free layer magnetization in the vicinity of the ABS. This is because the magnitude of the magnetic field applied to the free layer from the magnetic recording medium is damped exponentially the further away from the surface of the magnetic recording medium as is understood from the dependence on the element height position of the magnetic field applied to the free layer from the magnetic recording medium in FIG. 7, according to one embodiment. Thus, the mag-noise of the free layer magnetization in the upper part in the element height direction contributes little to the efficiency in spite of generation equal to that in the vicinity of the ABS. The region in the upper part in the element height direction is a region having a low SNR. In the present invention, the mag-noise and the dependence on the position in the element height direction of the efficiency are examined, and the structure used has a magnetic field controlling the magnetic domain applied to the free layer in the upper part in the element height direction which is larger than the magnetic field applied to the vicinity of the ABS. Thus, the mag-noise in the upper part in the element height direction, which hardly contributes at all to the output, can be substantially reduced. The mag-noise can be reduced while suppressing a decrease in the output for the entire magnetoresistive effect head.

Furthermore, in some approaches, the head SNR improves when applied to a magnetoresistive effect head having a narrow gap between the magnetic shields for the following reasons. As is clear from FIG. 7, according to one embodiment, the damping ratio of the magnetic field of the magnetic recording medium in the upper part in the element height direction becomes larger as the gap between the magnetic shields narrows, and a decrease in the SNR in the upper part in the element height direction is large in a magnetoresistive effect head having a narrow gap between the magnetic shields. As described earlier, the narrowing of the gap between the magnetic shields is indispensable in improving the resolution, that is, improving the linear recording density. Some embodiments can simultaneously satisfy the demands in a magnetic recording and playback device of improving the resolution and improving the head SNR.

Figure 8:
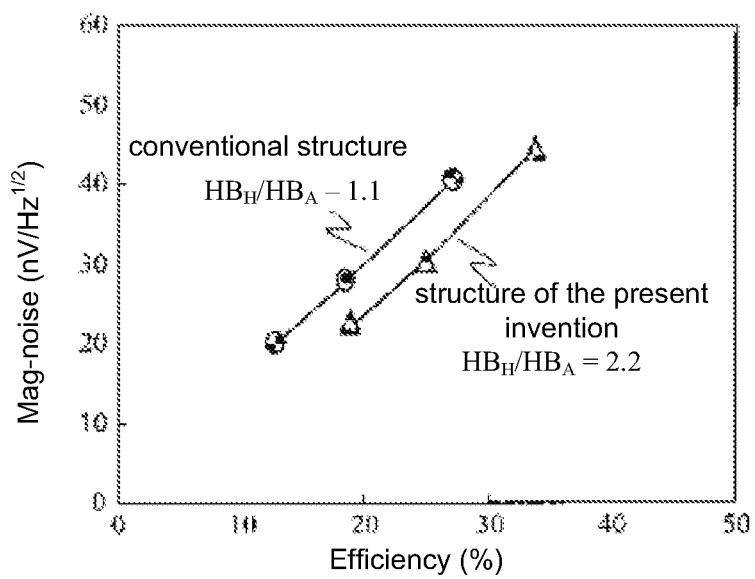
FIG. 8 is a graph showing the relationship between the mag-noise and the efficiency, according to one embodiment, and a conventional structure.

FIG. 8 shows the relationship between the mag-noise and the efficiency in the structure of this embodiment and a conventional structure. The efficiency is an index for indicating how much the free layer magnetization is rotated by the magnetic field applied from the magnetic recording medium, and is proportional to the magnitude of the applied magnetic field from the magnetic domain control layer to the free layer.

The efficiency depends on the magnitude of the magnetic field applied from the magnetic domain control layer. Because the efficiency is varied, the magnitude of the magnetic field from the magnetic domain control layer is varied by uniformly varying the film thickness of the insulation layer 3 as 3 nm, 4 nm, 5 nm in the element height direction. From FIG. 8, the mag-noise increases with the increase in the efficiency in both this embodiment and the example of the conventional structure. When the same efficiency is used, this embodiment has smaller mag-noise, and the mag-noise reduction effect by some embodiments may be confirmed.

Figure 9:
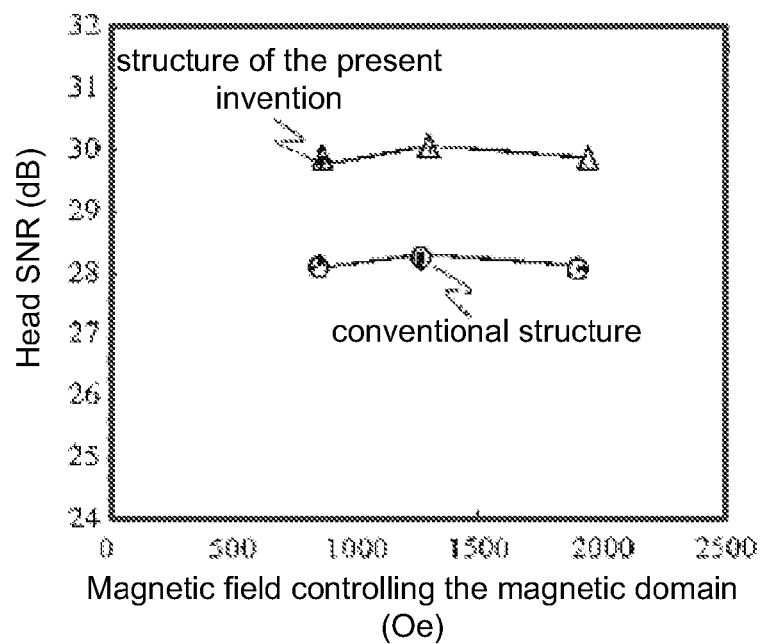
FIG. 9 is a graph showing the relationship of the head SNR and an average value of the entire region of the free layer of the magnetic field controlling the magnetic domain in this example structure and a conventional structure example.

FIG. 9 shows the relationship of the head SNR and the average value in the entire free layer of the magnetic field controlling the magnetic domain in this embodiment and the conventional example. In this embodiment, a higher head SNR than the conventional example can be achieved independent of the magnitude of the magnetic field controlling the magnetic domain. The reasons for the independence of the head SNR from the magnitude of the magnetic field controlling the magnetic domain are: the mag-noise is proportional to the efficiency, that is, the playback output, and the mag-noise under these conditions is sufficiently larger than the electrical noise. Thus, in the structure of this embodiment, the head SNR can be improved independent of the magnitude of the magnetic field controlling the magnetic domain.

Finally, an example of a manufacturing method for a playback head capable of satisfying Equation 1 is described in detail. The magnetoresistive effect head is formed by using fine processing technology on an aluminum titanium carbide (AlTiC) substrate. FIGS. 10 to 19 are schematic views of the process flow of the playback head section, according to one embodiment. In each drawing, the figure marked as (b) on the right side is a cross-sectional view seen from the ABS, and the figure marked (a) on the left side is the perpendicular view seen from the side corresponding to the top surface in the wafer state.

Figure 10B:
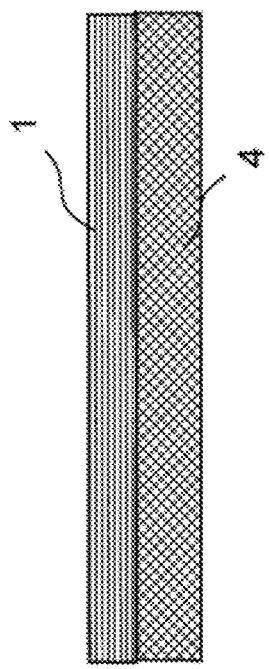
FIGS. 10(a)-10(b) are illustrative views which schematically show a method for manufacturing a playback head, according to one embodiment.
Figure 10A:
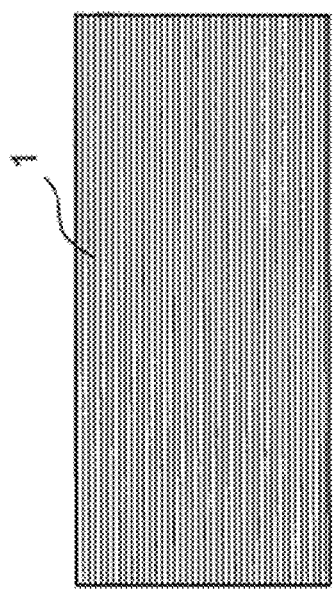
Figure 12B:
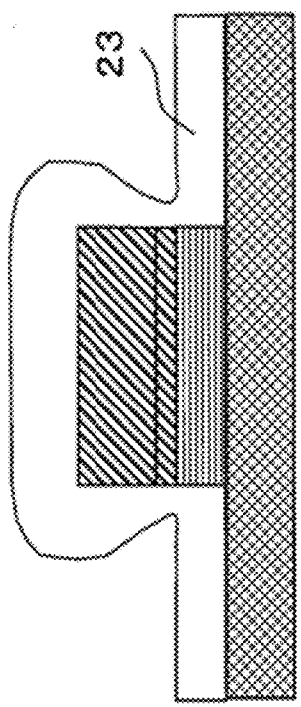
FIGS. 12(a)-12(b) are illustrative views continued from FIGS. 11(a)-11(b), according to one embodiment.
Figure 12A:
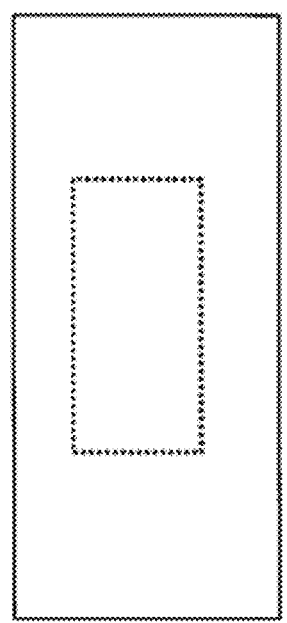
Figure 13B:
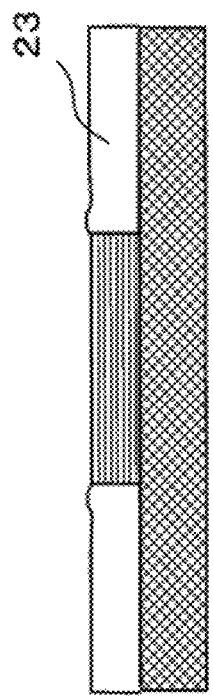
FIGS. 13(a)-13(b) are illustrative views continued from FIGS. 12(a)-12(b), according to one embodiment.
Figure 13A:
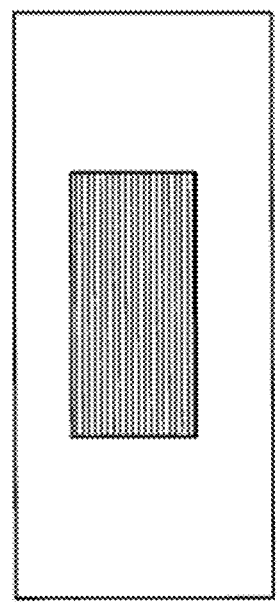

FIGS. 10(a)-10(b) are views of the stages for forming the lower magnetic shield layer 4 composed of permalloy and depositing a multilayered spin-valve magnetoresistive effect film on top, according to one embodiment. First, the element height pattern is processed. As shown in FIGS. 11(a)-11(b), a photoresist 21 is coated, and an element height pattern 22 is formed by photolithography, according to one embodiment. The peeling characteristic in the later lift-off process is considered, so the photoresist 21 uses a 2-layer resist structure with a bottom layer functioning as the peeling layer. Next, FIGS. 12(a)-12(b) show the stage in which ion milling is used to remove the magnetoresistive effect film with the photoresist as the mask, according to one embodiment, and, for example, alumina 23 was deposited as an insulation film. The resist and the insulation film in the upper part of the magnetoresistive effect film are removed by lift-off, and the state in FIGS. 13(a)-13(b) results, according to one embodiment.

Figure 14B:
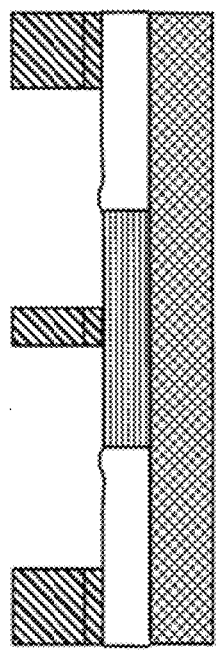
FIGS. 14(a)-14(b) are illustrative views continued from FIGS. 13(a)-13(b), according to one embodiment.
Figure 14A:
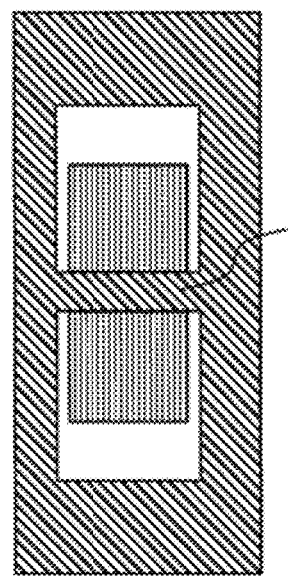

Next, a track width pattern 24 is formed. As shown in FIGS. 14(a)-14(b), photolithography is used to form the track width pattern in the photoresist similar to the previous element height process, according to one embodiment. This is transferred to the element by ion milling. After the unneeded magnetoresistive effect film and insulation film are removed, the thin insulation layer 3 composed of alumina as the insulation film in the side wall of magnetoresistive effect film and the magnetic domain control layer 2 are deposited, and the state in FIGS. 15(a)-15(b) results, according to one embodiment. The resist and the insulation film in the upper part of the magnetoresistive effect film and the magnetic domain control layer are removed by lift-off, and the state in FIGS. 16(a)-16(b) results, according to one embodiment. Thus, the basic structure of the playback sensor is completed. This process to this point is generally used in the processing of a magnetoresistive effect head. In this example, the element height pattern is processed first, followed by processing the track width pattern. Conversely, the method may process in the order of the track width and the element height.

After completion of the basic structure of the playback sensor, the upper cap layer and the upper magnetic shield may be formed, according to one embodiment. In this example of the structure, the upper cap layer and the upper magnetic shield are formed so that the magnetic shield gap is wider at the upper part of the element than at the ABS.

Figure 17A:
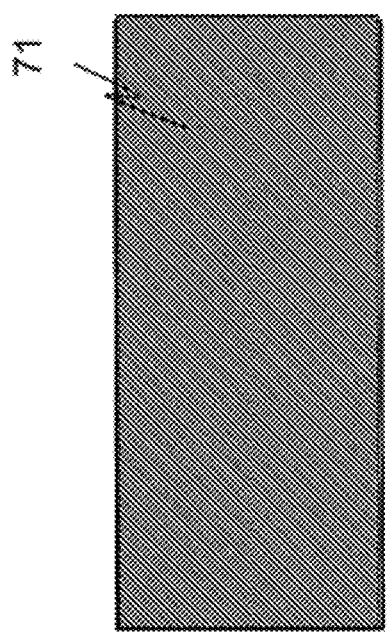
FIGS. 17(a)-17(c) are illustrative views continued from FIGS. 16(a)-16(b), according to one embodiment.
Figure 17B:
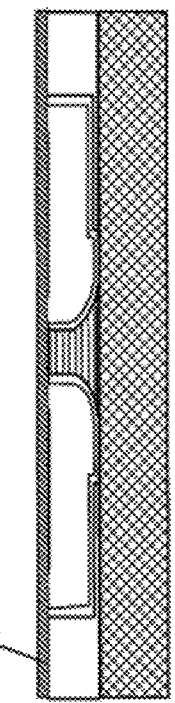
Figure 17C:
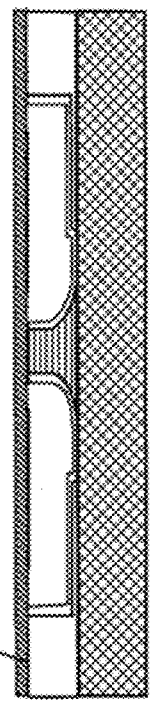

After completing the basic structure of the playback sensor shown in FIGS. 16(a)-16(b), an upper cap layer 71 is uniformly deposited, and the state in FIGS. 17(a)-17(c) results, according to one embodiment. FIG. 17(c) is a cross-sectional view in the opposite direction 180° to that in FIG. 17(b), which is a cross-sectional view of the magnetoresistive effect head seen from the topmost part in the element height direction, according to one embodiment. Next, an upper cap layer 72 is deposited only in the upper part in the element height direction, and the state in FIGS. 18(a)-18(d) results, according to one embodiment. FIG. 18(b) is a cross-sectional view on the ABS side, according to one embodiment. FIG. 18(c) is a cross-sectional view on the upper part side in the element height direction, according to one embodiment. FIG. 18(d) is a cross-sectional view seen from the direction 90° with respect to FIGS. 18(a)-18(b), according to one embodiment. In the resulting structure, a step difference is produced in the cap layers. A portion of the upper cap layer 72 is formed by a method in which a uniform film is deposited first, then the resist is formed only in the desired parts by using photolithography, and unneeded film on the ABS side is removed by ion milling with the resist as the mask. In addition, a method in which a resist is used to form a gradually tapered fan at the resist end surface of the mask, or a method having an inclined incident control condition in which the ion incident angle in ion milling is, for example, 50° from the perpendicular is used to form the gradual taper to the end surface of the cap layer 72. Thus, the step difference of the upper magnetic shield deposited on the cap layer is lessened, and the magnetic domain generation in the magnetic shields, which is connected to a drop in reliability, can be suppressed. Then, when the upper magnetic shield is deposited, the state in FIGS. 19(a)-19(c) results, according to one embodiment, and the magnetic shield gap at the upper part of the element can be wider than at the ABS. FIG. 19(b) is a cross-sectional view on the ABS side, according to one embodiment. FIG. 19(c) is a cross-sectional view on the upper part side in the element height direction, according to one embodiment.

As a supplement to the explanation, three other methods provided with a difference in the cap film thickness for satisfying Equation 2 are also described, according to some embodiments.

The first method, according to one embodiment, uniformly deposits an upper cap layer 71 and an upper cap layer 72 over the entire wafer surface, and then partially removes the cap layer 72 by asymmetric directional milling to produce an incline in the film thickness. The asymmetric directional milling is a method such as swing milling in which the wafer rotation during milling undergoes reciprocal motion in an angle range which is not a 360° rotation to limit the incident directions of the ions, and pulse milling in which an ion extraction voltage is applied only in an angle range in the 360° rotation to limit the range of the incident directions of the ions. The limited angle range used is a range from ±90° to ±30°. After the upper cap layer 72 is deposited, milling which asymmetrically limits the incident directions on the upper part side in the element height is used. The resist pattern adjacent to the upper part side of the element formed by photolithography is used as the mask, and milling is conducted so that the incident ions are limited to the range of ±45° centered on the upper part side in element height direction. Since the shadow section blocked by the mask cannot be removed, the result is that a film thickness difference in the upper cap layer 72 can be provided in the upper part in the element height direction and the ABS side. A method using the asymmetric directional milling provides a more gradual incline in the film thickness from the mask end to a distant part compared to the normal 360° rotation milling. Therefore, the advantages are that the resist pattern can be separated from the upper part of the element, and the degrees of freedom in the design of the incline in the film thickness can be increased.

The second method, according to one embodiment, provides a difference in the thickness of the cap film by resist undercut when the insulation film is formed in the upper part in the element height. In the forming process for the element height pattern 22 shown in FIGS. 11(a)-11(b), two or more resist layers capable of forming the resist undercut are used as the photoresist 21. A 3-layered structure of a peeling layer, an undercut resist layer, and a surface resist layer are formed on the substrate. The lower undercut resist layer corresponding to the upper photoresist has a reduction in the dimensions during developing and forms the undercut part. After the magnetoresistive effect film is removed similar to the example described earlier, the alumina 23 of the insulation film is deposited. The alumina for the undercut part is deposited in a form which runs onto the top of the magnetoresistive effect film at the end of the resist. Then, the lift-off is conducted, and the alumina on the resist is removed while the portion of the alumina which ran onto the top at the upper part end of the element remains. Then a process similar to the example described earlier is carried out to form the track pattern and successively deposit the cap layer 71, the cap layer 72, and the upper magnetic shield. The result is that the gap between the magnetoresistive effect film and the upper magnetic shield is separated further than at the ABS because the alumina at the end of the upper part of the element runs onto the magnetoresistive effect film, and a structure satisfying Equation 2 is formed. The addition of a new photolithography process is unnecessary in this method. The advantage is a small increase in the process cost and the manufacturing time because only the resist materials and the structures in the photolithography process have to be changed.

The third method, according to one embodiment, corresponds to a variation of the second method. In the process for forming the element height pattern 22 shown in FIGS. 11(a)-11(b), a trimming process of the photoresist 21 is added before the alumina 23 of the insulation film is deposited in the stage in which the magnetoresistive effect film is removed with the photoresist 21 which formed the pattern as the mask. An oxygen plasma asher or reactive ion etching (RIE) is used in the trimming. The photoresist recedes from the surface only by the desired amount by the trimming process and becomes a reduced form. Then, the alumina 23 of the insulation film is deposited as in the second method. Since the alumina 23 is formed to run onto the magnetoresistive effect film, similar to the second method, the gap between the magnetoresistive effect film and the upper magnetic shield can be more than the separation from the ABS. An advantage of the third method is more freedom in setting the recessed amount of the photoresist depending on the trimming conditions than in the second method.

By using the structures and processes described above, the magnetic shield gap is wider at the upper part of the element than at the ABS, according to one embodiment; a magnetoresistive effect head having a stronger magnetic field controlling the magnetic domain in the upper part of the element than the ABS can be achieved; and the head SNR is improved by the mag-noise reduction effect.

Figure 20:
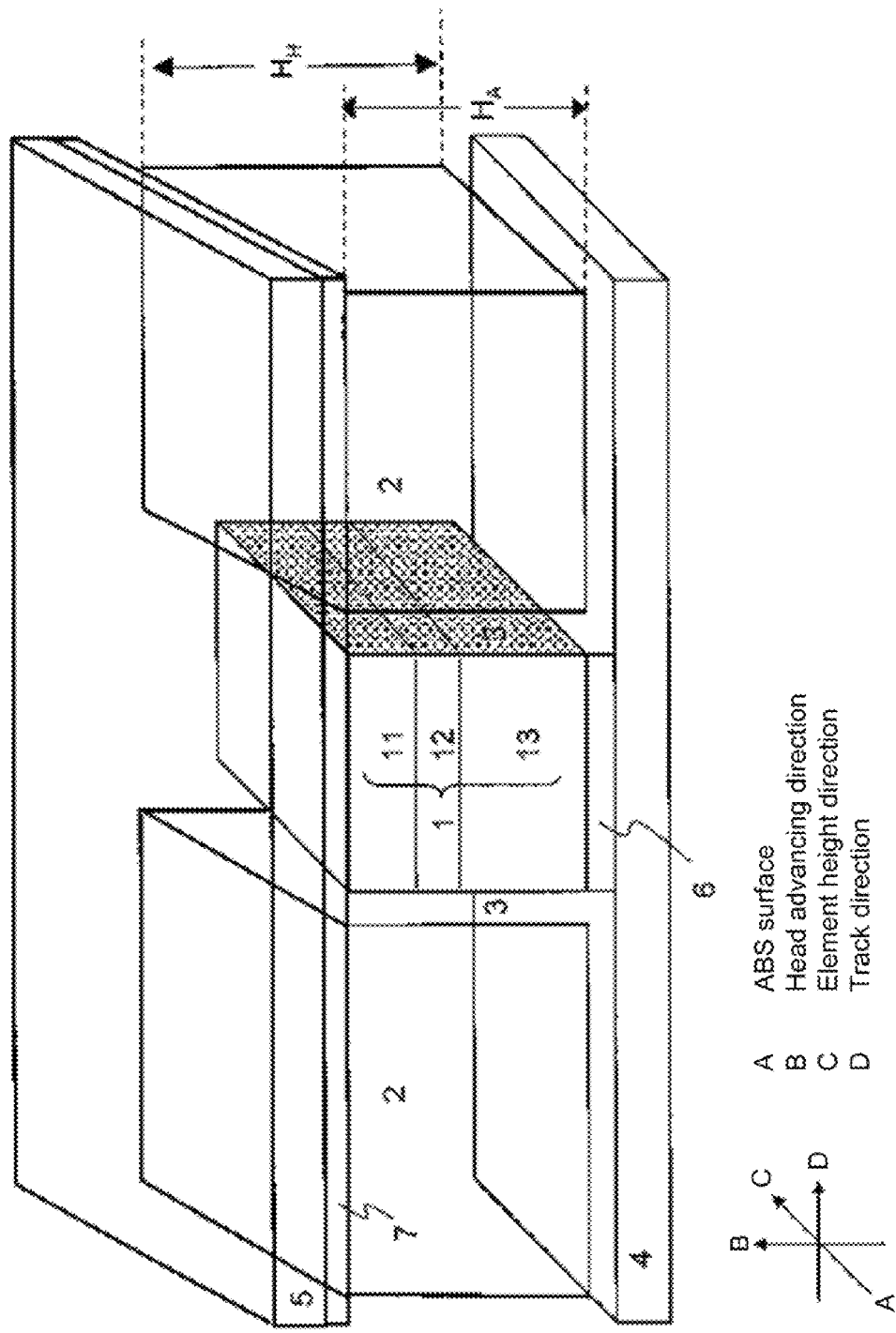
FIG. 20 is a perspective view of the magnetoresistive effect magnetic head when viewed from the ABS, according to one embodiment.
Figure 21:
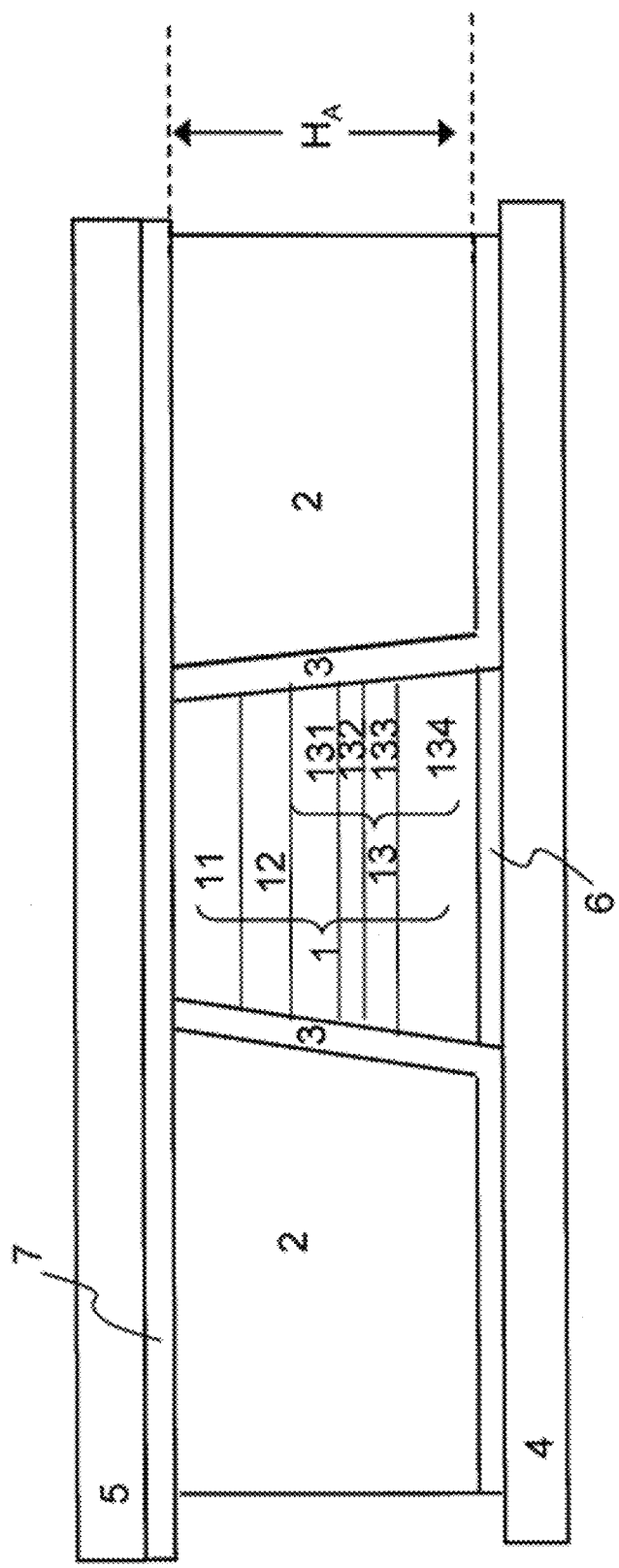
FIG. 21 is a cross-sectional view of the magnetoresistive effect head when viewed from the ABS, according to one embodiment.
Figure 22:
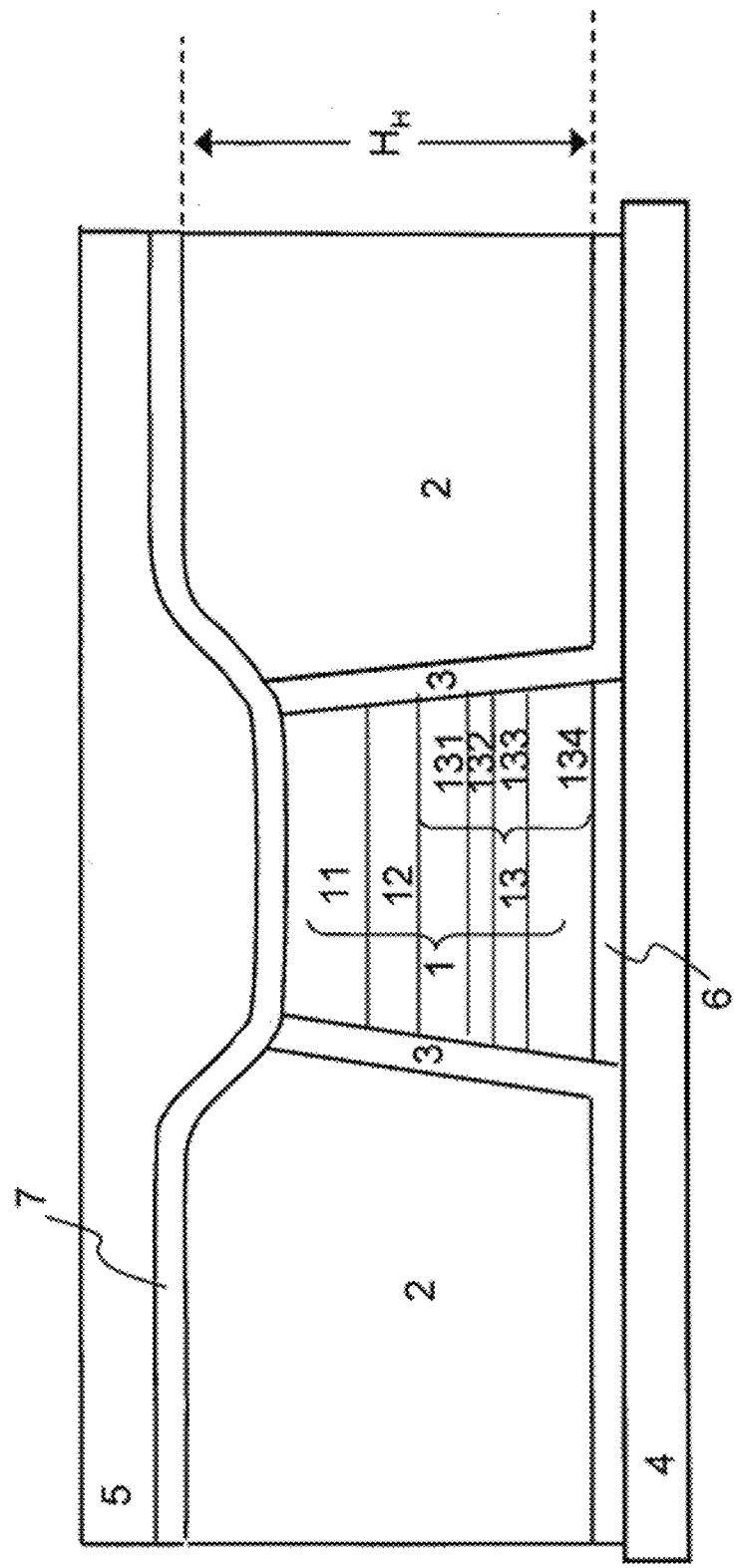
FIG. 22 is a cross-sectional view of the magnetoresistive effect head when viewed from the upper part in the element height direction, according to one embodiment.

Another structural example of the magnetoresistive effect head according to the present invention is described. FIG. 20 shows a perspective view of the magnetoresistive effect head of Embodiment 2 when viewed from the ABS, according to one embodiment. FIG. 21 is a cross-sectional view of the magnetoresistive effect head of this embodiment when viewed from the ABS. FIG. 22 is a cross-sectional view from the topmost part in element height direction, according to one embodiment. This embodiment is identical to the structural example in Embodiment 1 except for the structures of the magnetic domain control layer 2 and the upper cap film 7. Therefore, detailed descriptions of duplicate structures and effects in Embodiment 1 are omitted.

Figure 23:
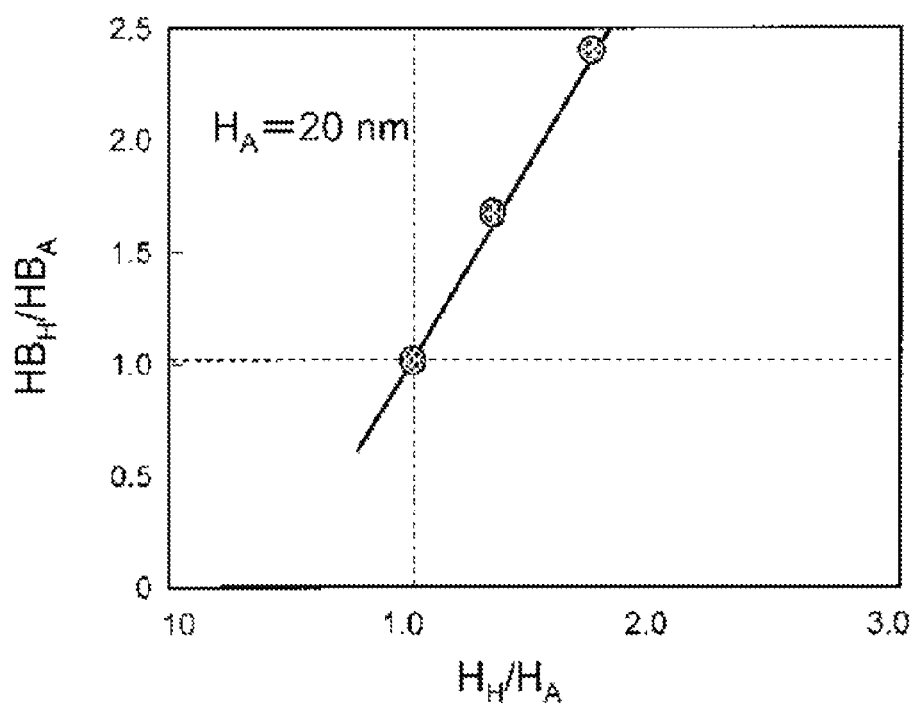
FIG. 23 is a graph showing the relationship between the $HB_H/HB_A$ ratio of the magnetic fields controlling the magnetic domains applied to the upper part of the element in the free layer and the vicinity of the ABS and the $H_H/H_A$ ratio of the film thickness $H_H$ of the magnetic domain control layer in the upper part of the element and the film thickness $H_A$ of the magnetic domain control layer in the vicinity of the ABS, according to one embodiment.

A feature of this embodiment is that the film thickness $H_H$ in the upper part in the element height direction of the magnetic domain control layer 2 is thicker than the film thickness $H_A$ in the vicinity of the ABS. FIG. 23 shows the relationship between the $HB_H/HB_A$ ratio of the magnetic field $HB_H$ controlling the magnetic domain applied to the upper part in the element height direction of the free layer 11 and the magnetic field $HB_A$ controlling the magnetic domain applied in the vicinity of the ABS, and the $H_H/H_A$ ratio of the film thickness $H_H$ of the magnetic domain control layer 2 in the upper part in the element height direction and the film thickness $H_A$ of the magnetic domain control layer in the vicinity of the ABS, according to one embodiment. In this embodiment, the film thickness of the magnetic domain control layer 2 in the upper part in the element height direction is thicker than in the vicinity of the ABS. In addition, since the magnetic shield gap in the upper part in the element height direction is necessarily larger than in the vicinity of the ABS, $H_H/H_A$ increases with $HB_H/HB_A$.

Similar to Embodiment 1, $HB_H/HB_A$ is preferably at least 1.4 as the condition for obtaining a noticeable improvement in the head SNR by mag-noise reduction. From the $HB_H/HB_A$ and the $H_H/H_A$ relationship in FIG. 23, $H_H/H_A$ is preferably at least 1.2. There is no particular limitation on the maximum value of the $H_H/H_A$. However, from the perspective of the manufacturing processes, the range capable of manufacturing with a good yield in practice is about 10 or fewer.

Table 2 shows the specific structure and the improvements in the playback characteristics of this embodiment. For comparison, Table 2 also shows an example of a conventional structure. The example of the conventional structure is identical to the example of the conventional structure shown in Embodiment 1. Similar to Embodiment 1, even in this embodiment, the head SNR can be improved by 2 dB over the example of the conventional structure. In this embodiment, since there is an incline from the upper part in the element height direction to the ABS in both the film thickness of the magnetic domain control layer and the magnetic shield gap, a large $HB_H/HB_A$ is obtained at a smaller difference in film thickness than in Embodiment 1.

TABLE 2

| | Embodiment 2 of an example structure | Example of a conventional structure |
| --- | --- | --- |
| $H_H/H_A$ | 1.4 | 1 |
| $HB_H/HB_A$ | 1.8 | 1.1 |
| Head SNR (dB) | 30 | 28 |

TABLE 2-continued

|  | Embodiment 2 of an example structure | Example of a conventional structure |
|---|---|---|
| Efficiency (%) | 26 | 27 |
| Mag-noise (nV/Hz$^{1/2}$) | 32 | 40 |

Specific processes for producing the magnetoresistive effect head in this embodiment are described below. The means for implementing the structure of this embodiment is broadly divided into two methods. The first method deposits from one direction to produce an incline in the film thickness when the magnetic domain control layer is deposited. The second method produces an incline in the film thickness of the magnetic domain control layer by unidirectional milling when the magnetic domain control layer is shaved off by lift-off after the magnetic domain control layer is uniformly deposited similar to Embodiment 1.

In the first method, the processes are identical to Embodiment 1 until the track width pattern is formed by a photoresist and copied to an element by ion milling as shown in FIGS. 14(a)-14(b) in Embodiment 1, and the unneeded magnetoresistive effect film and the insulation film are removed. Then, a thin insulation layer 3 composed of alumina is deposited as the insulation film in the side wall of the magnetoresistive effect film, and the magnetic domain control layer 2 is given an incline in the film thickness by depositing from one direction by directional ion beam deposition (IBD). The result is shown in FIGS. 24(a)-24(e), according to one embodiment. FIG. 24(b) is a cross-sectional view of the ABS side. FIG. 24(c) is a cross-sectional view of the upper part side in the element height direction. The mask of the track width pattern may be as shown in FIG. 24(a').

The directional IBD limits the incident angle range of the ion beam by a method similar in principle to the directional milling described in Embodiment 1. However, the beam for the deposition is incident from the side opposite to the milling. The methods are a method which has a wafer rotation during the deposition of the magnetic domain control layer by the ion beam in reciprocating motion within an angle range, which is not a 360° rotation, and a method which applies an ion extraction voltage only in an angle range in a 360° rotation. The limited angle range used is a range from ±90° C. to ±30° with the ABS side at the center. The property of the difficulty in depositing by the beam in the shadow part of the track width pattern by a photoresist is used to form a tapered film thickness in the magnetic domain control layer toward the upper part in the element height direction from the ABS side adjacent to the resist on the ABS side of the track width pattern shown in FIGS. 24(a)-24(c). The incline of the film thickness in FIGS. 24(a)-24(c) was formed by an incident ion beam limited to the ±45° range with the ABS side at the center.

Figure 25B:
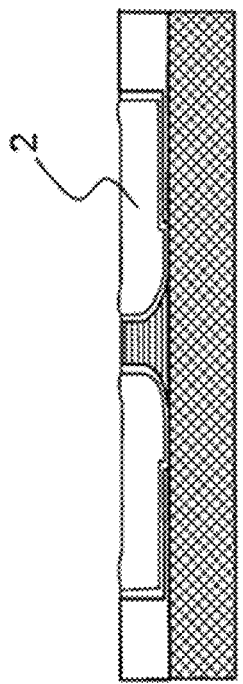
FIGS. 25(a)-25(c) are illustrative views continued from FIGS. 24(a)-24(c), according to one embodiment.
Figure 25C:
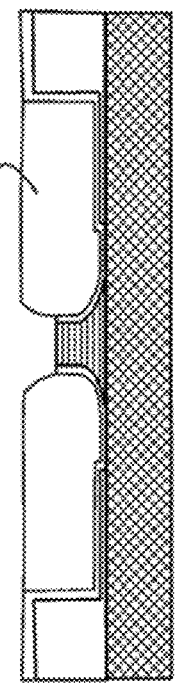
Figure 25A:
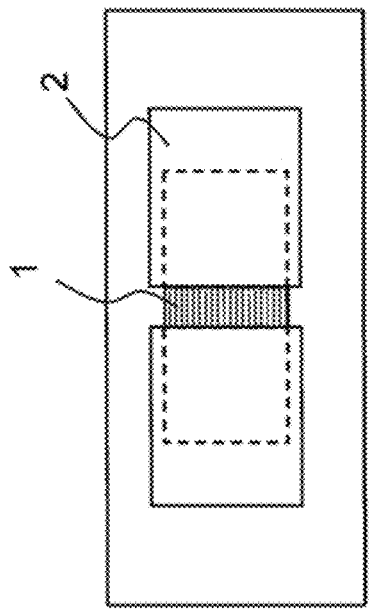

Next, the resist and the insulation film in the upper part of the magnetoresistive effect film and the magnetic domain control layer are removed by lift-off to produce the state in FIGS. 25(a)-25(c) and complete the basic structure of the playback sensor, according to one embodiment. FIG. 25(b) is a cross-sectional view of the ABS side, according to one embodiment. FIG. 25(c) is cross-sectional view of the upper part side in the element height direction, according to one embodiment. Then, the upper cap layer and the upper magnetic shield layer are deposited uniformly. The result is shown in FIGS. 26(a)-26(c), according to one embodiment. FIG. 26(b) is a cross-sectional view of the ABS side, according to one embodiment. FIG. 26(c) is the cross-sectional view of the upper part side in the element height direction, according to one embodiment.

Figure 15B:
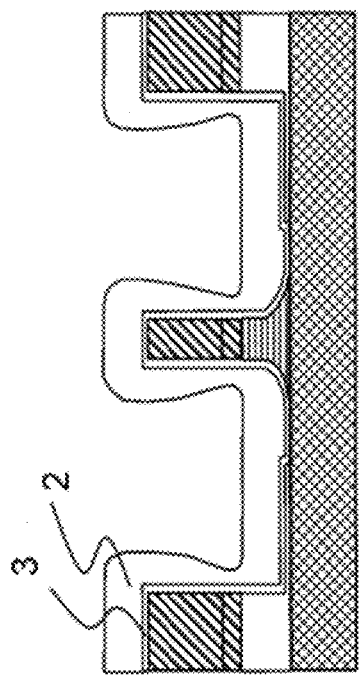
FIGS. 15(a)-15(b) are illustrative views continued from FIGS. 14(a)-14(b), according to one embodiment.
Figure 15A:
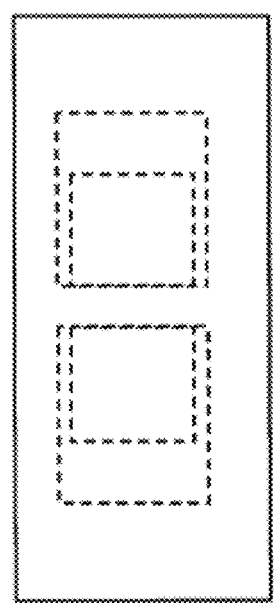

In the second method, the processes are identical to Embodiment 1 until the magnetic domain control layer 2 is deposited, and the result is shown in FIGS. 15(a)-15(b), according to one embodiment. Next, unidirectional milling is conducted in the upper part in the element height direction, and a difference in the film thickness is produced in the magnetic domain control layer as shown in FIGS. 24(b)-24(c). The directional milling method uses the same swing milling as described in Embodiment 1, or can use pulse milling. The resist shadow on the upper part side in the element height direction of the track width pattern is used in the directional milling to form the taper in the film thickness in the magnetic domain control layer in the upper part in the element height direction. Then, the resist and the insulation film it the upper part of the magnetoresistive effect film and the magnetic domain control layer are removed by lift-off, and the upper cap layer and the upper magnetic shield are uniformly deposited. In contrast to the first method, this method forms an incline in the film thickness by removal using milling. Because only the unneeded parts are removed after depositing a film having uniform magnetic characteristics, the advantage is that the magnetic characteristics of the magnetic domain control layer are well maintained in principle.

Figure 27:
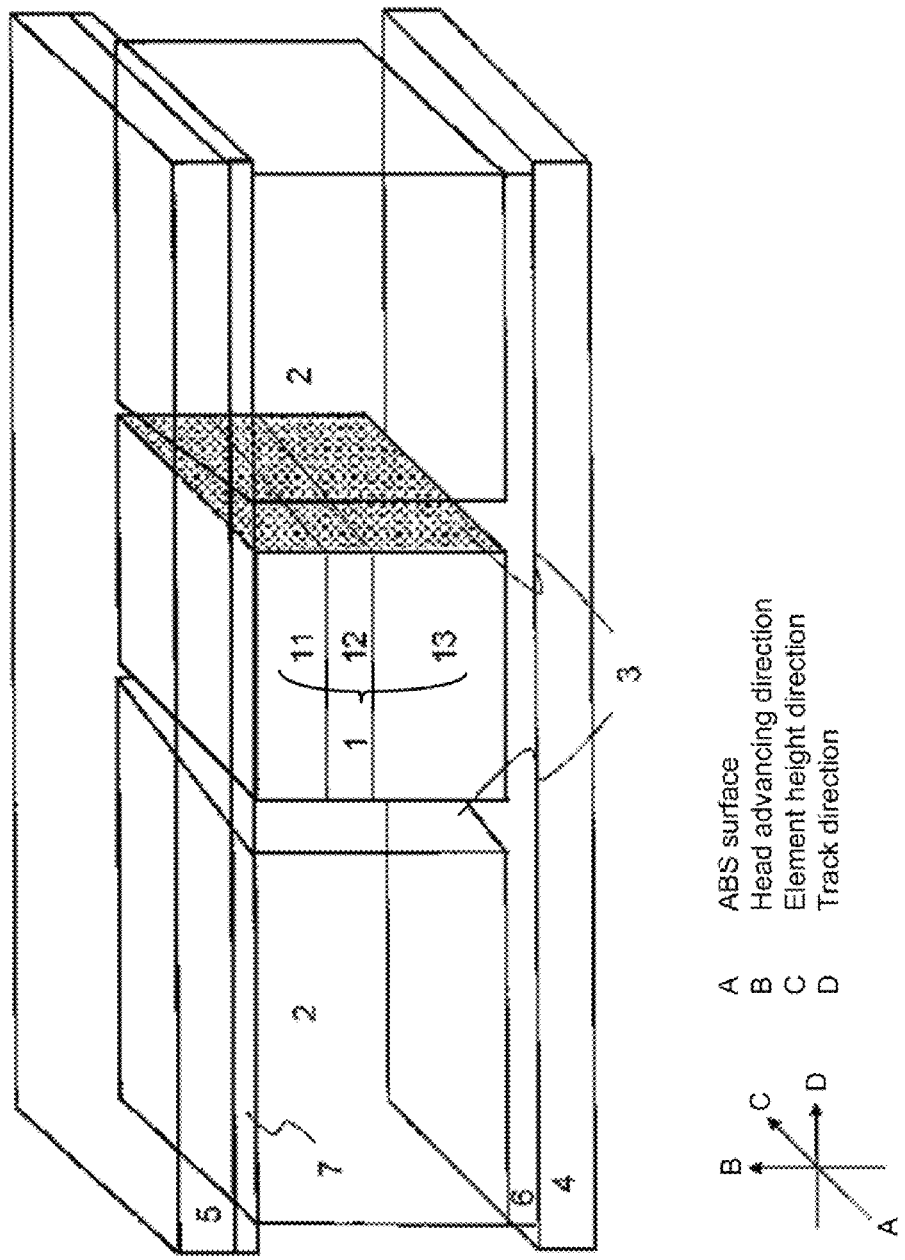
FIG. 27 is a perspective view of the magnetoresistive effect magnetic head when viewed from the ABS, according to one embodiment.
Figure 28:
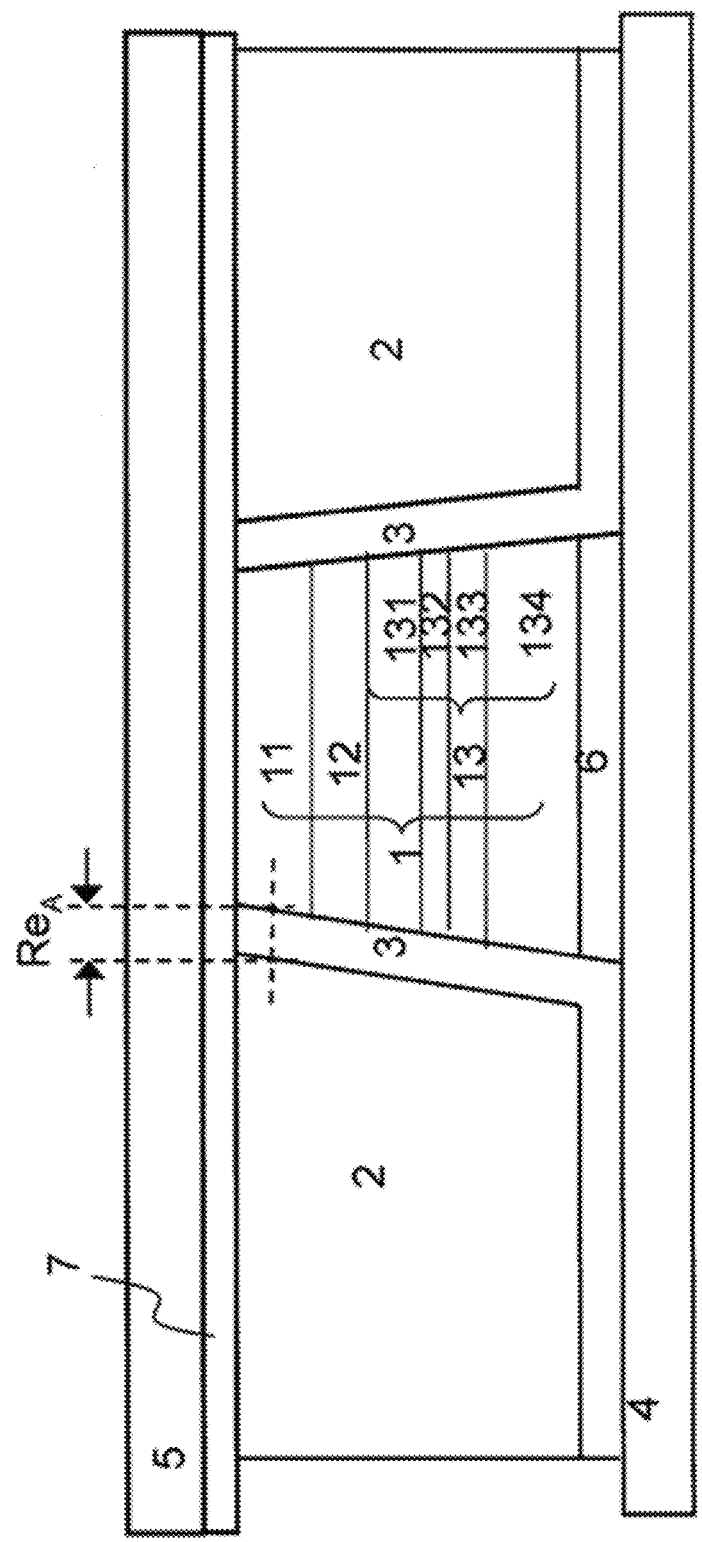
FIG. 28 is a cross-sectional view of the magnetoresistive effect head when viewed from the ABS, according to one embodiment.
Figure 29:
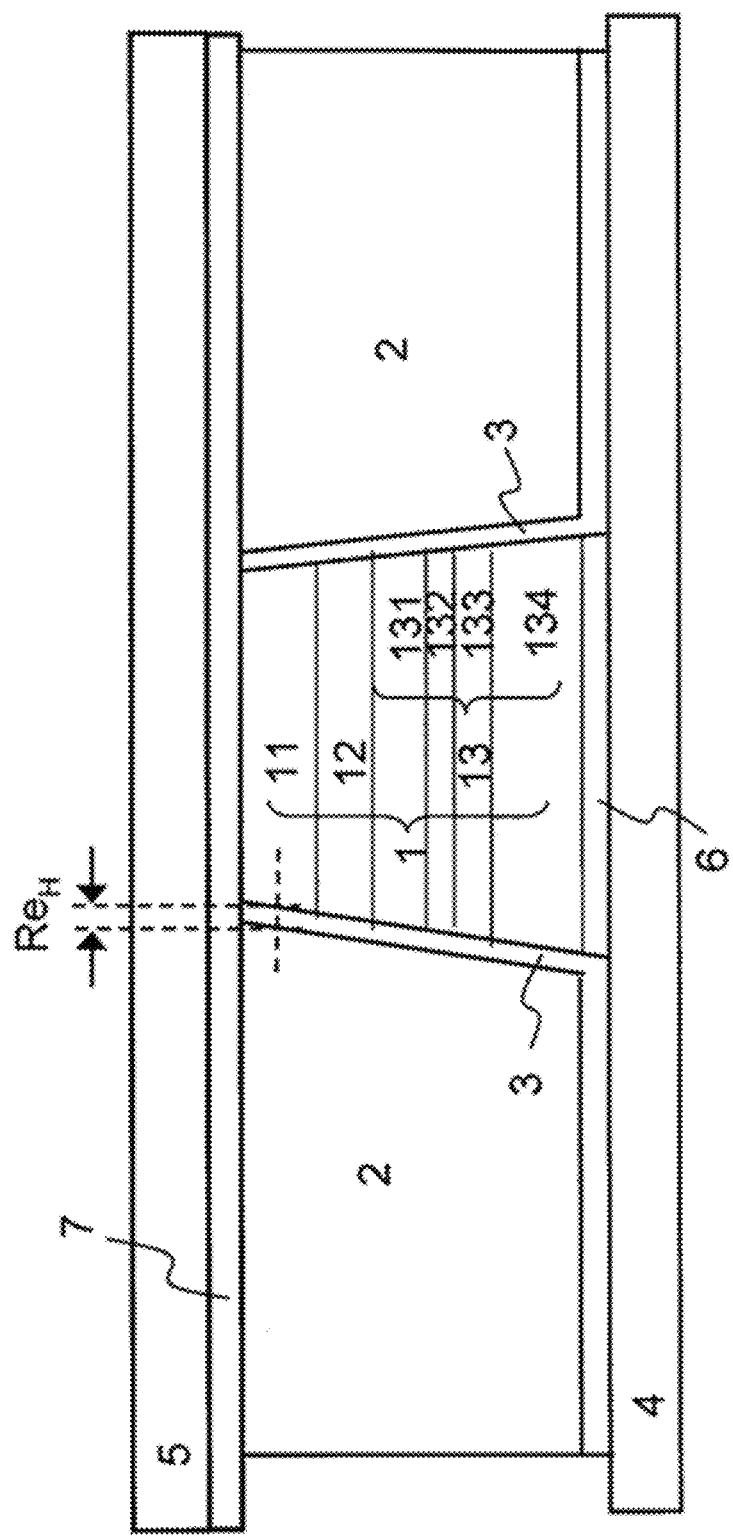
FIG. 29 is a cross-sectional view of the magnetoresistive effect head when viewed from the upper part in the element height direction, according to one embodiment.

A third embodiment according to the present invention is described. FIG. 27 shows a perspective view of the magnetoresistive effect head of this embodiment viewed from the ABS, according to one embodiment. FIG. 28 is a cross-sectional view of the head of this embodiment viewed from the ABS. FIG. 29 is a cross-sectional view seen from the topmost part in the element height direction, according to one embodiment. A feature of this embodiment is that the film thickness of the insulation layer 3 varies in the element height direction. The other structures are identical to Embodiment 1 except that the magnetic shield gap in the element height direction does not change, or are identical to the structures in Embodiment 2 except that the film thickness of the magnetic domain control layer in the element height direction does not vary. Detailed descriptions are omitted of duplicate structures and effects in the description of Embodiment 1.

Figure 30:
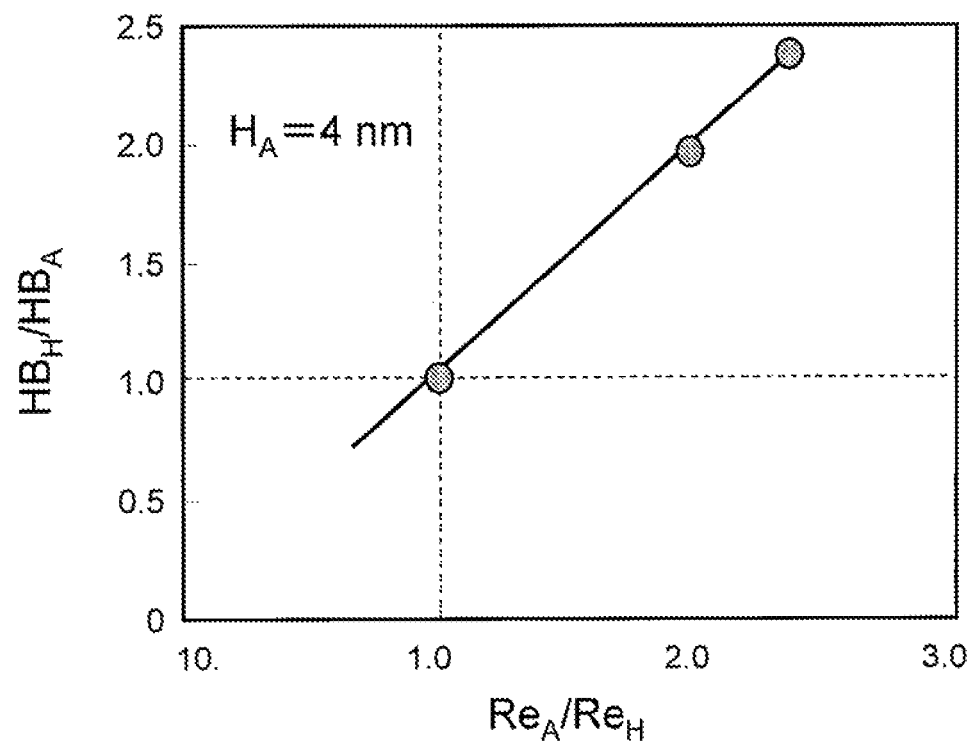
FIG. 30 is a graph showing the relationship of the $HB_H/HB_A$ ratio of the magnetic fields controlling the magnetic domains applied to the upper part of the element and the free layer in the vicinity of the ABS and the $Re_A/Re_B$ ratio of the film thicknesses of the insulation layers in the vicinity of the ABS and in the upper part of the element, according to one embodiment.

A feature of this embodiment is that the film thickness $Re_H$ of the insulation layer 3 in the upper part in the element height direction of the magnetic domain control layer 2 is thinner than the film thickness $Re_A$ in the vicinity of the ABS. FIG. 30 shows the relationship between the $HB_H/HB_A$ ratio of the magnetic fields controlling the magnetic domains applied to the free layer II in the upper part in the element height direction and in the vicinity of the ABS, and the $Re_A/Re_H$ ratio of the film thicknesses of the insulation layer 3 in the vicinity of the ABS and in the upper part of the element, according to one embodiment. In this embodiment, the upper part in the element height direction has a smaller distance between the magnetic domain control layer 2 and the free layer 11 than in the vicinity of the ABS. Therefore, the magnetic field controlling the magnetic domain applied to the free layer in the upper part in the element height direction is larger than in the vicinity of the ABS. As described in Embodiment 1, preferably, the structure has an $HB_B/HB_A$ of at least 1.4. In this embodiment, the structure is formed so that $Re_A/Re_H$ is at least 1.3 from FIG. 30. In addition, the maximum value or $Re_A/Re_H$ is preferably less than approximately 20. The reason is that the film thickness of the insulation layer 3 is preferably less than 10 nm from the perspective of maintaining the stable operation in the free layer of the magnetic field for the magnetic domain control layer in the vicinity of the ABS, and at least 0.5 nm from the perspective of resistance to damage during processing.

As in Embodiments 1 and 2 based on the above structures, the head SNR can be approximately 30 dB, an approximate 2 dB improvement over the conventional structure. Because the film thickness of the insulation film controlled in this embodiment is sensitive to the magnetic field controlling the magnetic domain, and because the effect is evident at a film thickness difference of several nanometers, a feature is that a large difference does not have to be produced in the structure on the ABS side and the upper part side in the element height direction compared to Embodiments 1 and 2.

The specific process for manufacturing the head of this embodiment is described below. The head in this embodiment can be manufactured by applying a process similar to the one in Embodiment 2 when the insulation layer 3 is processed. The methods are roughly classified into the following two methods. The first method deposits from one direction to produce an incline in the film thickness when the insulation layer 3 is deposited. The second method produces an incline by repeatedly shaving from one direction by unidirectional milling after uniformly depositing the insulation layer 3.

Figure 31B:
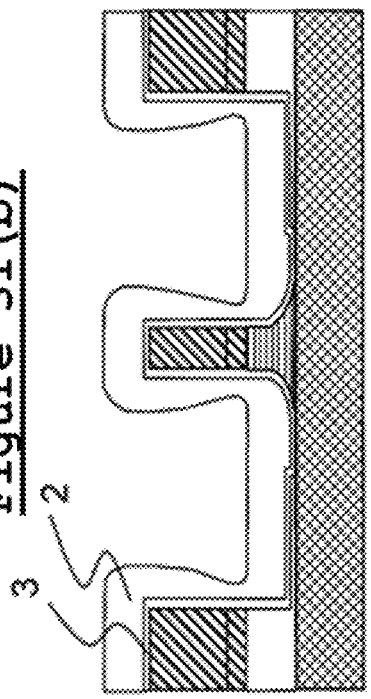
FIGS. 31(a)-31(c) are illustrative views which schematically show a method for manufacturing a playback head, according to one embodiment.
Figure 31C:
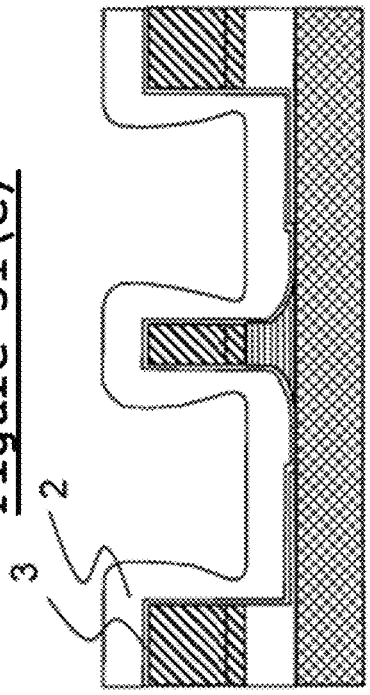
Figure 31A:
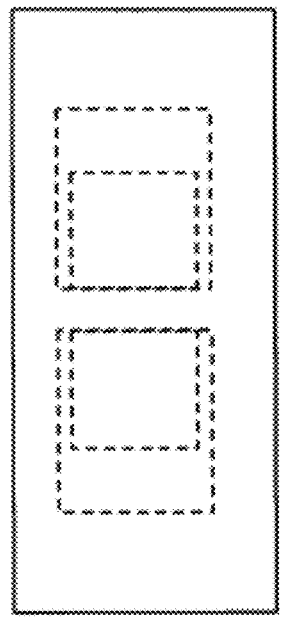

In the first method, the processes are identical to Embodiment 1 until the track width pattern is formed by a photoresist as shown in FIGS. 14(a)-14(b) in Embodiment 1 and copied to the element by ion milling, then the unneeded magnetoresistive effect film and insulation film are removed. Next, when a thin insulation layer 3 composed of alumina is deposited as the insulation film of the side wall of magnetoresistive effect film, an incline in the film thickness is produced by depositing from the upper part in the element height direction by directional IBD as in the embodiment described above to deposit the magnetic domain control layer 2, and the result is shown in FIGS. 31(a)-31(c), according to one embodiment. FIG. 31(b) is a cross-sectional view seen from the ABS, according to one embodiment. FIG. 31(c) is the cross-sectional view in the upper part in the element height direction, according to one embodiment. Then, the resist and the insulation film in the upper part of the magnetoresistive effect film and the magnetic domain control layer are removed by lift-off, and the upper cap layer and the upper magnetic shield layer are uniformly deposited.

In the second method, the processes are identical to Embodiments 1 and 2 until the insulation layer 3 is uniformly deposited. Next, as in the embodiments described above, the insulation layer 3 is repeatedly shaved by unidirectional milling from the ABS side to produce an incline in the film thickness of the insulation layer 3. Then, the magnetic domain control layer 2 is uniformly deposited, and the resist and the insulation film in the upper part of the magnetoresistive effect film and the magnetic domain control layer are removed by lift-off, and the upper cap layer and the upper magnetic shield layer are uniformly deposited.

Figure 32:
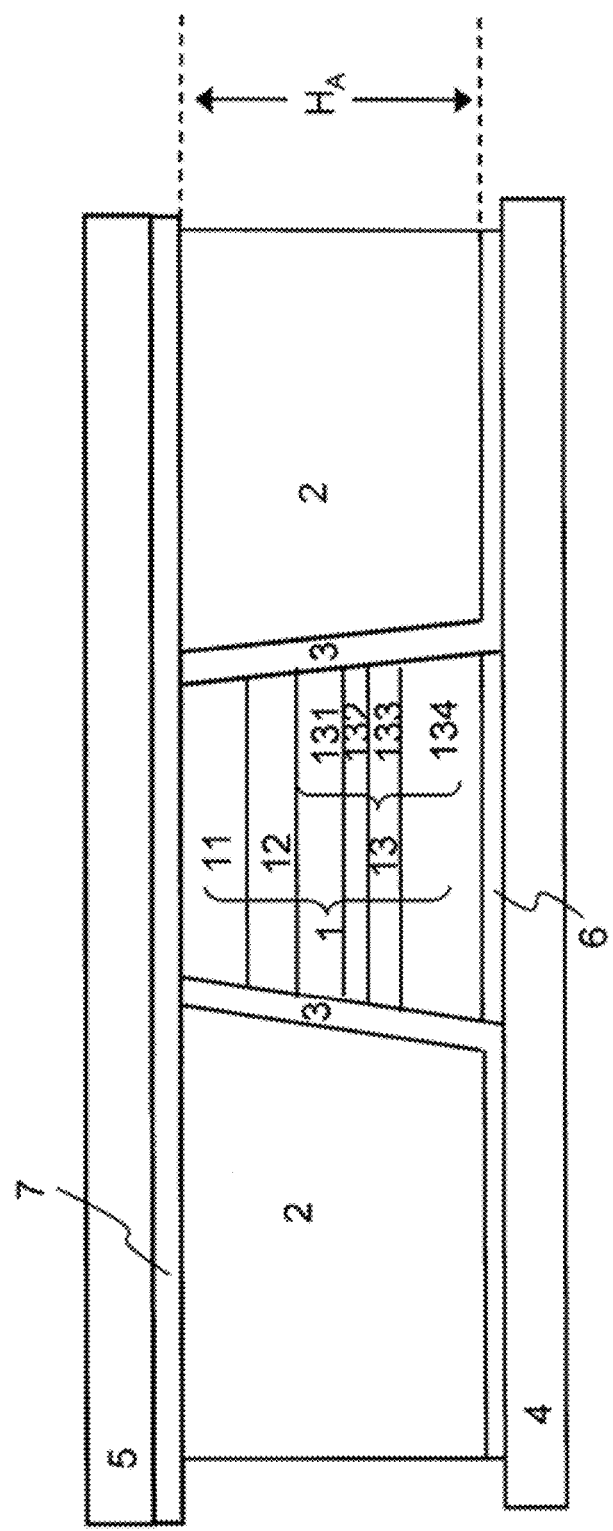
FIG. 32 is a cross-sectional view of the magnetoresistive effect head when viewed from the ABS, according to one embodiment.
Figure 33:
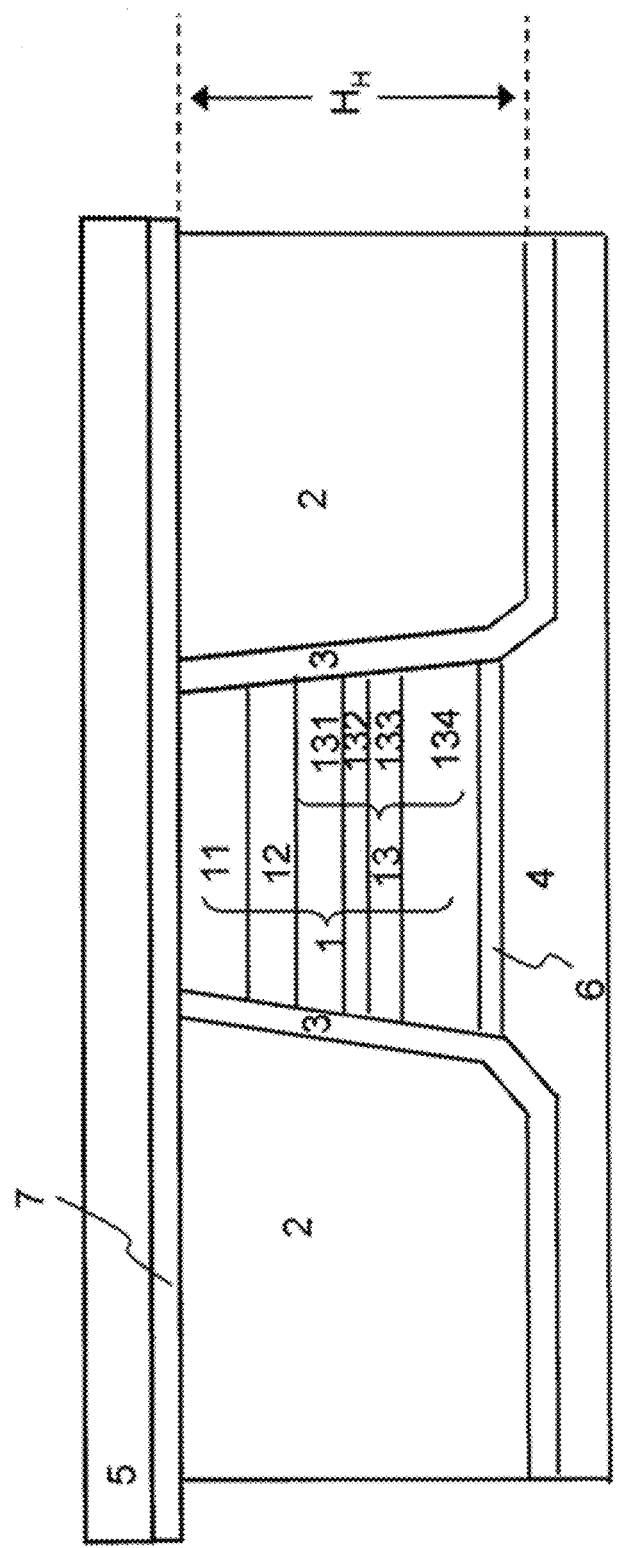
FIG. 33 is a cross-sectional view of the magnetoresistive effect head when viewed from the upper part in the element height direction, according to one embodiment.

A fourth embodiment according to the present invention is described. FIGS. 32 and 33 are cross-sectional views of the magnetoresistive effect head according to this embodiment seen from the ABS and the topmost part in the element height direction, respectively. In part in the element height direction than at the ABS by giving an incline to the top surface of the magnetic domain control layer on the magnetic shield side in the upper part from the vicinity of the ABS to the upper part in the element height direction. In contrast, a feature of this embodiment is that the film thickness of the magnetic domain control layer is thicker in the upper part in the element height direction than at the ABS by giving an incline to the lower surface of the magnetic domain control layer toward the substrate side. The other structures are the same as the conventional structure described in Embodiment 1. Therefore, detailed descriptions are omitted of duplicate structures and effects in the description of Embodiment 1; As in the structure in Embodiment 2, in this embodiment, the film thickness of the magnetic domain control layer is thicker in the upper part in the element height direction than in the vicinity of the ABS, and the mag-noise above the element can be effectively reduced. Consequently, in this embodiment, the head SNR can be improved by approximately 2 dB than in the conventional structure.

Figure 34B:
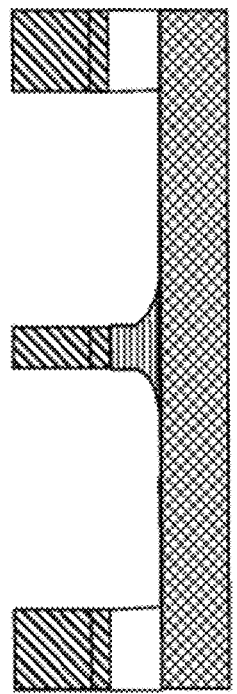
FIGS. 34(a)-34(c) are illustrative views showing a method for manufacturing a playback head, according to one embodiment.
Figure 34C:
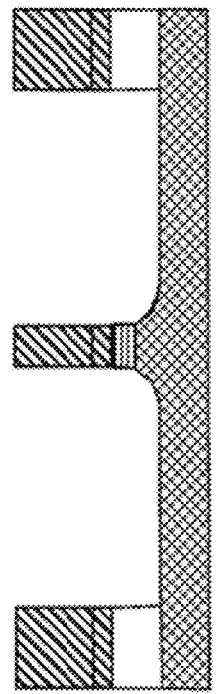
Figure 34A:
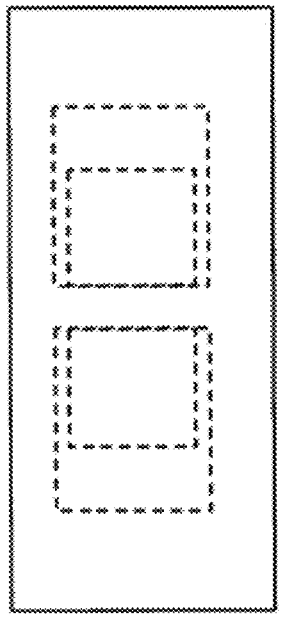

The specific process for manufacturing the head of this embodiment is described below. The processes are identical to the conventional embodiment until the track width pattern is formed by a photoresist when using photolithography as with the previous element height as shown in FIGS. 14(a)-14(b). Next, when the track width pattern is copied to the element by ion milling, an incline can be carved in the lower magnetic shield by directional milling from the ABS side. The result is shown in FIGS. 34(a)-34(c), according to one embodiment. FIG. 34(b) is a cross-sectional view of the ABS side, according to one embodiment. FIG. 34(c) is a cross-sectional view of the upper part side in the element height direction, according to one embodiment. Then, an insulation layer and a magnetic domain control layer are uniformly deposited as in the conventional structure.

Figure 35:
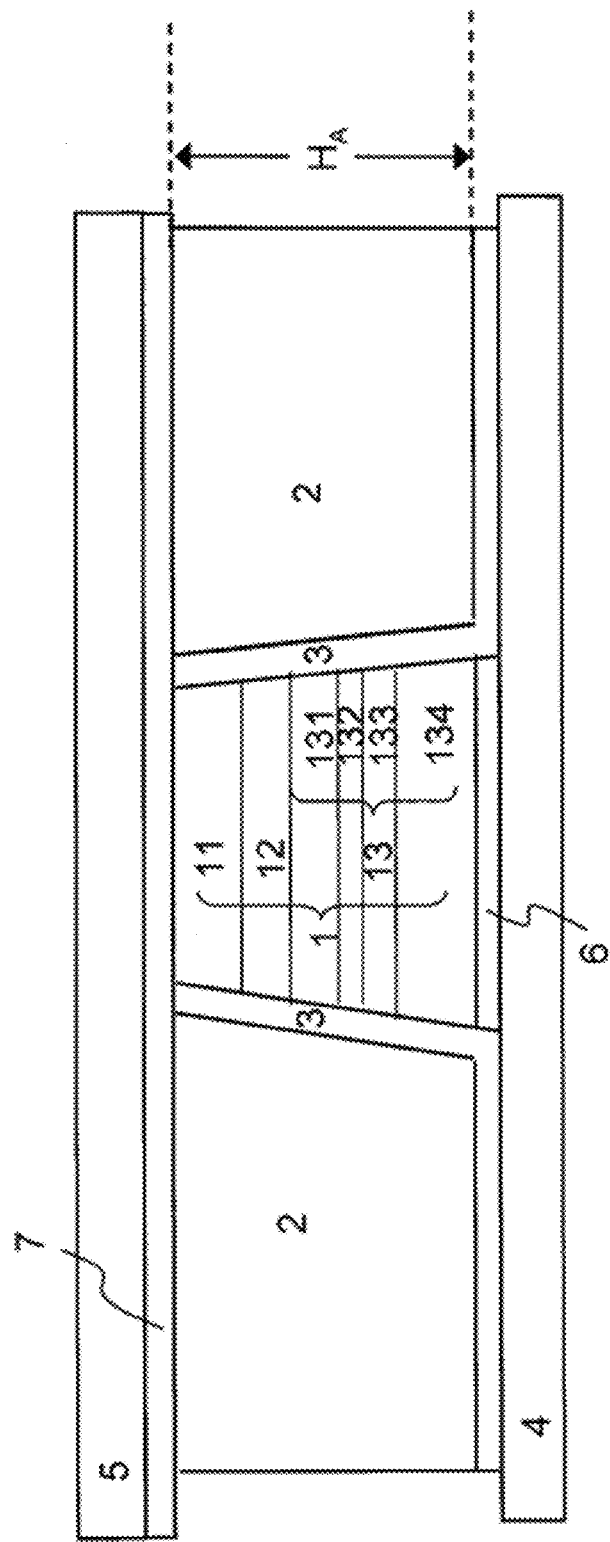
FIG. 35 is a cross-sectional view of the magnetoresistive effect head when viewed from the ABS, according to one embodiment.
Figure 36:
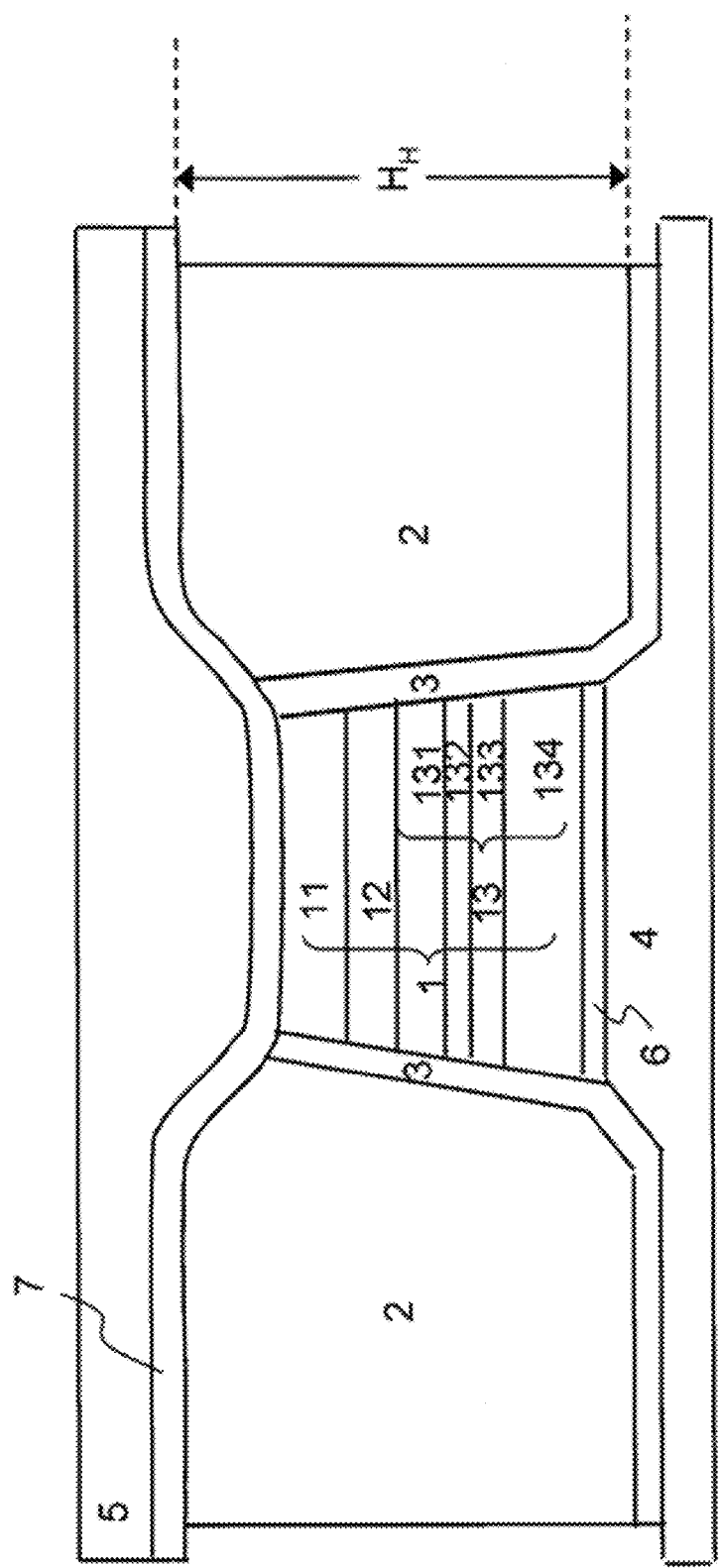
FIG. 36 is a cross-sectional view of the magnetoresistive effect head when viewed from the upper part in the element height direction, according to one embodiment.

A fifth embodiment according to the present invention is described. FIGS. 35 and 36 show cross-sectional views of the magnetoresistive effect head of this embodiment seen from the ABS and the upper part in the element height direction, respectively. This embodiment is a structure which has the features of both Embodiments 2 and 4. Specifically, the film thickness of the magnetic domain control layer is thicker in the upper part in the element height direction than at the ABS by producing an incline in the upper surface and the lower surface of the magnetic domain control layer 2 from the vicinity of the ABS to the upper part of the element toward the upper magnetic shield side and the substrate side. The other structures are the same as the conventional structure described in Embodiment 1. Detailed descriptions of duplicate structures and effects as in Embodiment 1 are omitted.

Similar to Embodiment 2, in this embodiment, the film thickness of the magnetic domain control layer is thicker in the upper part in the element height direction than in the vicinity of the ABS. The mag-noise above the element can be effectively reduced, and the head SNR can be improved. This embodiment has more complicated processing steps than Embodiments 2 and 4. However, the advantages are that the film thickness difference in the magnetic domain control layer in the vicinity of the ABS and in the upper part in the element height direction is easily increased, and the centers of the free layer and the magnetic domain control layer are easily aligned. The magnetoresistive effect head of this embodiment can be manufactured by the processing steps described in Embodiments 2 and 4.

Figure 37:
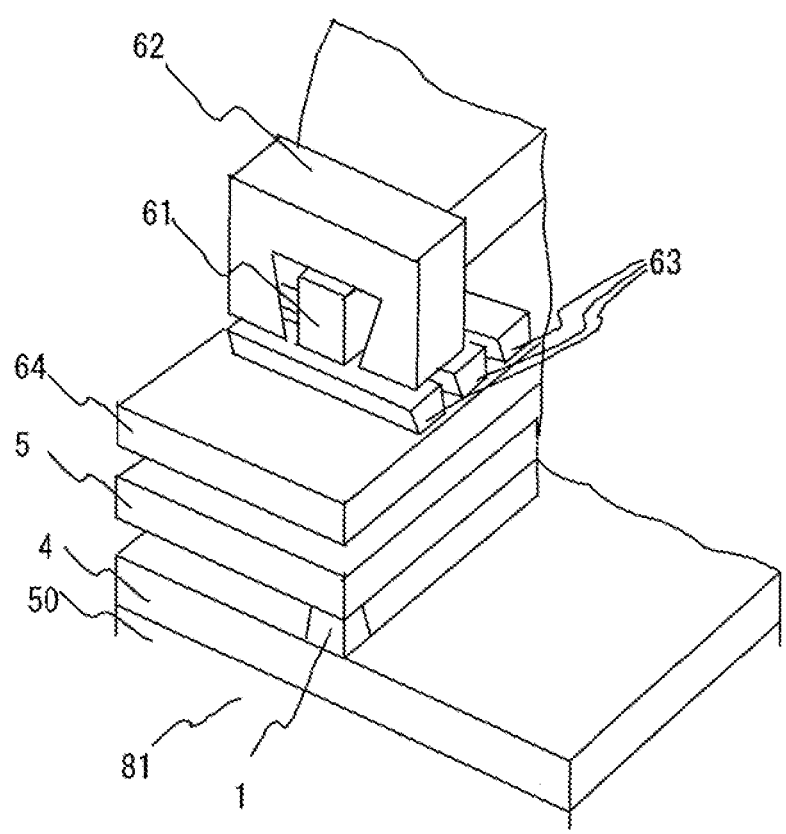
FIG. 37 is a view showing an example structure of a separate recording and playback magnetic heads for vertical recording, according to one embodiment.

FIG. 37 is a schematic view of a magnetic head for vertical magnetic recording equipped with the magnetoresistive effect head, according to one embodiment. A lower magnetic shield 4, a magnetoresistive effect film 1, an upper magnetic shield 5, an auxiliary magnetic pole 64, a coil 63, a main magnetic pole 61, and a wrap-around shield 62, which is a magnetic shield enclosing the main pole, are formed on the substrate 50 which acts as a slider, and has an ABS 81. In this drawing, the structure is provided with both an upper magnetic shield and an auxiliary magnetic pole, but the structure may be used as both the upper magnetic shield and the auxiliary magnetic pole. In addition, the structure does not have to have the wrap-around shield 62.

Figure 38:
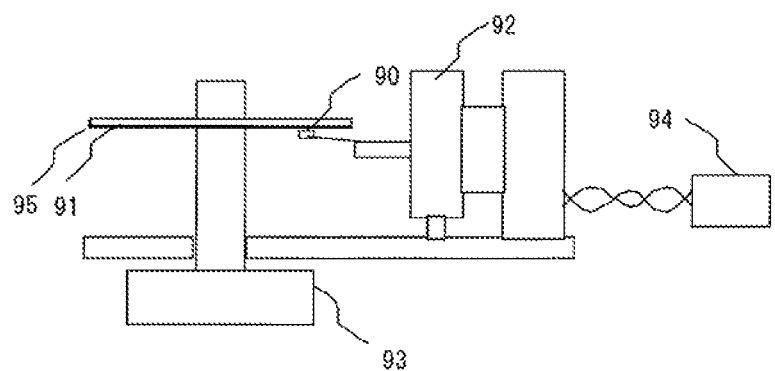
FIG. 38 is a schematic view of a magnetic recording and playback device, according to one embodiment.

FIG. 38 is a schematic view showing an example structure of a magnetic recording and playback device using vertical magnetic recording, according to one embodiment. A disk 91 holding a magnetic recording medium 95 for magnetically recording information is rotated by a spindle motor 93, and a head slider 90 is guided above the tracks of the disk 91 by an actuator 92. In other words, in the magnetic disk device, a playback head and a recording head formed above the head slider 90 have relative motion adjacent to the desired recording position above the disk 91 by using this mechanism, and sequentially write and read the signals. Preferably, the actuator 92 is a rotary actuator. The recording signal is recorded on the medium through a signal processing system 94 by the recording head. The output of the playback head is obtained as a signal through the signal processing system 94. Furthermore, when the playback head is moved above the desired recording track, the highly sensitive output from the playback head can be used to detect the position on the track, control the actuator, and position the head slider. In this drawing, one head slider 90 and one disk 91 are shown, but a plurality may be provided. In addition, the disk 91 may have recording media 95 on both sides and record information. When the information is recorded on both sides of the disk, the head sliders 90 are positioned on both sides of the disk.

The mag-noise can be reduced, and the head SNR improved by constructing a magnetic recording and playback device equipped with a magnetoresistive effect head of the present invention as the playback head.

The structure of the present invention can be used in a magnetic sensor and a magnetic head having the vertical current magnetoresistive effect, and a magnetic sensor and a magnetic head having the tunnel magnetoresistive effect.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A magnetoresistive effect head, comprising:
    a lower magnetic shield on a substrate;
    a magnetoresistive effect film laminated from a pinned layer with a pinned direction of magnetization;
    an intermediate layer;
    a free layer having a varying direction of magnetization controlled by an applied external magnetic field;
    a magnetic domain control layer formed with an intervening insulation layer on both sides in a track width direction of the magnetoresistive effect film;
    an upper magnetic shield; and
    electrodes for directing sense current flow in a direction perpendicular to a film surface of the magnetoresistive effect film,
    wherein a magnetic field applied by the magnetic domain control layer to a region away from an air bearing surface (ABS) of the free layer is at least 1.4 times larger than a magnetic field applied by the magnetic domain control layer to a region near the ABS of the free layer,
    wherein the lower magnetic shield and the upper magnetic shield act as the electrodes such that the sense current flows in the direction perpendicular to the film surface of the magnetoresistive effect film, and
    wherein a distance between the upper magnetic shield and a center of the free layer in a region away from the ABS is at least 1.3 times a distance between the upper magnetic shield and the center of the free layer at the ABS.

2. The magnetoresistive effect head described in claim 1, wherein the magnetic domain control layer comprises a CoPt alloy.

3. A magnetic recording and playback device, comprising:
    a magnetoresistive effect head as described in claim 1; and
    a recording head.

4. The magnetoresistive effect head described in claim 1, wherein a gap between the lower magnetic shield and the upper magnetic shield is wider in the region away from the ABS than in the region near the ABS.

5. The magnetoresistive effect head described in claim 4, wherein the lower magnetic shield and the upper magnetic shield act as electrodes such that the sense current flows in the direction perpendicular to the film surface of the magnetoresistive effect film.

6. A magnetic recording and playback device, comprising:
    a magnetoresistive effect head as described in claim 5; and
    a recording head.

7. A magnetic recording and playback device, comprising:
    a magnetoresistive effect head as described in claim 4; and
    a recording head.

8. The magnetoresistive effect head described in claim 1, wherein a film thickness of the magnetic domain control layer is thicker at a position away from the ABS than at a position near the ABS.

9. The magnetoresistive effect head described in claim 8, wherein the lower magnetic shield and the upper magnetic shield act as electrodes such that the sense current flows in the direction perpendicular to the film surface of the magnetoresistive effect film.

10. A magnetic recording and playback device, comprising:
    a magnetoresistive effect head as described in claim 8; and
    a recording head.

11. The magnetoresistive effect head described in claim 8, wherein the magnetic domain control layer has an inclined upper surface.

12. The magnetoresistive effect head described in claim 11, wherein the lower magnetic shield and the upper magnetic shield act as electrodes such that the sense current flows in the direction perpendicular to the film surface of the magnetoresistive effect film.

13. A magnetic recording and playback device, comprising:
    a magnetoresistive effect head as described in claim 11; and
    a recording head.

14. The magnetoresistive effect head described in claim 8, wherein the magnetic domain control layer has an inclined lower surface.

15. The magnetoresistive effect head described in claim 14, wherein the lower magnetic shield and the upper magnetic shield act as electrodes such that the sense current flows in the direction perpendicular to the film surface of the magnetoresistive effect film.

16. A magnetic recording and playback device, comprising:
    a magnetoresistive effect head as described in claim 14; and
    a recording head.

17. The magnetoresistive effect head described in claim 1, wherein a film thickness in a track width direction of the intervening insulation layer on both sides of the magnetoresistive effect film is thicker at a position near the ABS than at a position away from the ABS.

18. The magnetoresistive effect head described in claim 17, wherein the lower magnetic shield and the upper magnetic shield act as electrodes such that the sense current flows in the direction perpendicular to the film surface of the magnetoresistive effect film.

19. A magnetic recording and playback device, comprising:
a magnetoresistive effect head as described in claim 17; and
a recording head.

20. A magnetoresistive effect head, comprising:
a lower magnetic shield on a substrate;
a magnetoresistive effect film laminated from a pinned layer with a pinned direction of magnetization;
an intermediate layer;
a free layer having a varying direction of magnetization controlled by an applied external magnetic field;
a magnetic domain control layer formed with an intervening insulation layer on both sides in a track width direction of the magnetoresistive effect film;
an upper magnetic shield; and
electrodes for directing sense current flow in a direction perpendicular to a film surface of the magnetoresistive effect film,
wherein a magnetic field applied by the magnetic domain control layer to a region away from an air bearing surface (ABS) of the free layer is at least 1.4 times larger than a magnetic field applied by the magnetic domain control layer to a region near the ABS of the free layer,
wherein a cap layer is positioned between the magnetoresistive effect film and the upper magnetic shield, and
wherein a film thickness of the cap layer is thicker at a position away from the ABS than at a position near the ABS.

21. The magnetoresistive effect head described in claim 20, wherein the lower magnetic shield and the upper magnetic shield act as electrodes such that the sense current flows in the direction perpendicular to the film surface of the magnetoresistive effect film.

22. A magnetoresistive effect head, comprising:
a lower magnetic shield provided on a substrate;
a magnetoresistive effect film laminated from a pinned layer with a pinned direction of magnetization;
an intermediate layer;
a free layer having a varying direction of magnetization;
a magnetic domain control layer formed with an intervening insulation layer on both sides in a track width direction of the magnetoresistive effect film;
an upper magnetic shield;
a cap layer positioned between the magnetoresistive effect film and the upper magnetic shield; and
electrodes for directing sense current flow in a direction perpendicular to a film surface of the magnetoresistive effect film,
wherein a distance between the upper magnetic shield and a center of the free layer in a region away from an air bearing surface (ABS) is at least 1.3 times a distance between the upper magnetic shield and the center of the free layer at the ABS,
wherein a gap between the lower magnetic shield and the upper magnetic shield is wider in the region away from the ABS than in the region near the ABS, and
wherein a film thickness of the cap layer is thicker at a position away from the ABS than at a position near the ABS.

23. The magnetoresistive effect head described in claim 22, wherein the lower magnetic shield and the upper magnetic shield act as the electrodes such that the sense current flows in the direction perpendicular to the film surface of the magnetoresistive effect film.

24. A magnetic recording and playback device, comprising:
a magnetoresistive effect head as described in claim 22; and
a recording head.

25. The magnetoresistive effect head described in claim 22, wherein a thickness of the upper magnetic shield above the center of the free layer is the same as a thickness of the upper magnetic shield above the magnetic domain control layer.

26. The magnetoresistive effect head described in claim 22, wherein a thickness of the upper magnetic shield at the ABS is the same as a thickness of the upper magnetic shield away from the ABS.

* * * * *

UNITED STATES PATENT AND TRADEMARK OFFICE
CERTIFICATE OF CORRECTION

PATENT NO.        : 8,537,505 B2
APPLICATION NO.   : 12/784405
DATED             : September 17, 2013
INVENTOR(S)       : Masato Shiimoto It is certified that error appears in the above-identified patent and that said Letters Patent is hereby corrected as shown below:

In the specification:

col. 7, line 61 replace "The" with --the--;

col. 17, line 30 replace "24(a)-24(e)," with --24(a)-24(c),--;

col. 18, line 18 replace "it" with --in--;

col. 18, line 50 replace "II" with --11--;

col. 19, line 59 replace "In part" with --In Embodiment 2, the film thickness of the magnetic domain control layer was thicker in the upper part--.

Signed and Sealed this
Twelfth Day of November, 2013

Teresa Stanek Rea
*Deputy Director of the United States Patent and Trademark Office*